United States Patent
Adinolfi et al.

(10) Patent No.: US 11,164,988 B2
(45) Date of Patent: Nov. 2, 2021

(54) PHOTOVOLTAGE FIELD-EFFECT TRANSISTOR

(71) Applicant: THE GOVERNING COUNCIL OF THE UNIVERSITY OF TORONTO, Toronto (CA)

(72) Inventors: Valerio Adinolfi, San Francisco, CA (US); Edward Sargent, Ontario (CA)

(73) Assignee: THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 0 days.

(21) Appl. No.: 16/484,300

(22) PCT Filed: Feb. 7, 2018

(86) PCT No.: PCT/CA2018/050140
§ 371 (c)(1),
(2) Date: Aug. 7, 2019

(87) PCT Pub. No.: WO2018/145204
PCT Pub. Date: Aug. 16, 2018

(65) Prior Publication Data
US 2019/0363215 A1 Nov. 28, 2019

Related U.S. Application Data

(60) Provisional application No. 62/455,833, filed on Feb. 7, 2017.

(51) Int. Cl.
*H01L 31/112* (2006.01)
*H01L 31/02* (2006.01)
*H01L 31/0352* (2006.01)
*H01L 31/0368* (2006.01)

(52) U.S. Cl.
CPC .... *H01L 31/1129* (2013.01); *H01L 31/02019* (2013.01); *H01L 31/03682* (2013.01); *H01L 31/035218* (2013.01)

(58) Field of Classification Search
CPC .......... H01L 31/1129; H01L 31/02019; H01L 31/035218; H01L 31/03682; H01L 31/112; Y02E 10/546
See application file for complete search history.

(56) References Cited

U.S. PATENT DOCUMENTS

2015/0364545 A1 12/2015 Heo et al.
2018/0175241 A1* 6/2018 Jain .................. B82Y 10/00

OTHER PUBLICATIONS

Zhongquiang, et al., "High-sensitive hybrid photodetector based on CdSe quantum dots 1-29 and graphene for detecting ATP bioluminescence on lab-on-chip devices," IEEE Biomedical Circuits and Systems Conference (BioCAS), pp. 1-4. (2015).

(Continued)

*Primary Examiner* — David P Porta
*Assistant Examiner* — Meenakshi S Sahu
(74) *Attorney, Agent, or Firm* — Hamilton, Brook, Smith & Reynolds, P.C.

(57) ABSTRACT

In an embodiment, a photodetector is provided that provides a sensitizing medium adapted to receive electromagnetic radiation creating a junction with a transport channel, wherein the transport channel is adapted to exhibit a change in conductivity in response to reception of electromagnetic radiation by the sensitizing medium.

33 Claims, 19 Drawing Sheets

(56) References Cited

OTHER PUBLICATIONS

International Search Report for International Application No. PCT/CA2018/050140, entitled Photovoltage Field-Effect Transistor, consisting of 2 pages, dated May 7, 2018.
Written Opinion of the International Searching Authority for International Application No. PCT/CA2018/050140, entitled Photovoltage Field-Effect Transistor, consisting of 3 pages, dated May 7, 2018.

* cited by examiner

PHOTOVOLTAGE FIELD-EFFECT TRANSISTOR

This application is the U.S. National Stage of International Application No. PCT/CA2018/050140, filed Feb. 7, 2018, which designates the U.S., published in English, and claims the benefit of U.S. Provisional Application No. 62/455,833, filed Feb. 7, 2017. The entire teachings of the above applications are incorporated herein by reference.

FIELD

The present application pertains to the field of electronic circuits and in particular to silicon photodetectors.

BACKGROUND

It is of intense interest to extend the excellent performance of silicon photodetectors into the infrared spectrum beyond silicon's bandgap. Detection of infrared radiation is important for applications such as night vision, health monitoring, spectroscopy, object inspection, and optical communications. Silicon is the workhorse of modern electronics, but its electronic bandgap prevents detection of light at wavelengths longer than ~1100 nm.

The ideal IR photodetector must combine fast response time, high responsivity, and low power consumption with facile fabrication. Early efforts in this direction based on epitaxial semiconductors such as III-V and germanium added complexity in the fabrication process due to epitaxial crystal growth requirements as well as the need to mitigate silicon contamination/doping.

Recently, black silicon was reported, an IR sensitive material obtained that employs laser treatment of the silicon surface. Unfortunately, this technology suffers from low responsivity at infrared wavelengths ($10^{-2}$-$10^{-1}$ A/W).

Colloidal quantum dots (CQDs) have enabled photodetectors that benefit from IR sensitivity, high light absorption, wavelength tunability, low cost and room-temperature solution-processing. However, these have yet to be integrated meaningfully with silicon. In a heterojunction photodiode or traditional photo-Field Effect Transistor (photoFET), modest transport in the quantum dot solid limits performance of the device.

Therefore, there is a need for a photodetector that is not curtailed by the photoconductive effect, a mechanism that produces either responsive-but-slow, or fast-but-unresponsive, photodetectors.

More generally, there is a need for a photodetector that provides for selective sensitivity to a particular wavelength, or wavelengths, of electromagnetic radiation. There is a further need for a photodetector that is efficient at wavelengths beyond the standard silicon bandgap.

This background information is provided to reveal information believed by the applicant to be of possible relevance to the present application. No admission is necessarily intended, nor should be construed, that any of the preceding information constitutes prior art against the present application.

SUMMARY

In an embodiment, a photovoltage field effect transistor (PVFET) is presented that uses silicon for charge transport, but adds photosensitization via a sensitizing medium. In some aspects, the sensitizing medium comprises a quantum dot electromagnetic radiation absorber. In some aspects, the sensitizing medium is sensitive to electromagnetic radiation that is outside the conventional silicon bandgap.

In an embodiment, a photodetector is provided that provides a sensitizing medium for receiving incident electromagnetic radiation and generating bound photocharges. A transport channel adjacent to the sensitizing medium is adapted to change at least one electrical property when photocharges are generated in the sensitizing medium. Evaluation of the at least one electrical property provides for an estimate of the incident electromagnetic radiation. In some aspects, the at least one electrical property comprises a conductivity of the transport channel.

In an embodiment, a photodetector is provided. The photodetector may comprise: a transport channel consisting of a first semiconductor of a first dopant type, the transport channel sandwiched between a sensitizing medium and a substrate semiconductor; the sensitizing medium consisting of a second semiconductor of a second dopant type; and, the substrate semiconductor of the second dopant type; wherein illuminating the sensitizing medium with electromagnetic radiation modulates the built-in potential between the sensitizing medium and the substrate, and induces a change in conductivity of the transport channel.

In an embodiment, a photodetector is provided. The photodetector may comprise: a substrate semiconductor; the substrate supporting, and in contact with, a transport channel semiconductor; the transport channel supporting, and in contact with, a sensitizing medium semiconductor, a positive contact, and a negative contact; the positive contact located at an opposite end of the transport channel from the negative contact, and bracketing the sensitizing medium; and, wherein the transport channel forms a semiconductor: semiconductor heterojunction with the sensitizing medium. In some aspects, the sensitizing medium comprises at least one nano-semiconductor. In some aspects, the sensitizing medium comprises at least one quantum dot. In some aspects, the transport channel comprises a monocrystalline structure, and wherein the sensitizing medium comprises a polycrystalline structure. In some aspects, the sensitizing medium comprises a solid film that includes at least one semiconductor quantum dot.

In an embodiment, a photodetector is provided. The photodetector may comprise: a Silicon-based channel supported by a Silicon-based substrate; the Silicon-based channel connected to, and separating, a source and a drain; a quantum dot layer deposited on top of the Silicon-based channel, the quantum dot layer and Silicon-based substrate being oppositely doped from the silicon-based channel.

In an embodiment, a photodetector may be provided that uses the photovoltage generated at the silicon:quantum dot heterointerface to detect electromagnetic radiation. In some aspects, the quantum dot layer is sensitive to electromagnetic radiation at different wavelengths than the silicon layer. In some aspects, the electromagnetic radiation may be detected at wavelengths longer than ~1100 nm. In an implementation of the photodetector, the photovoltage, combined with the high transconductance provided by the silicon device, provides a high gain (e.g. >$10^4$ electrons/photon at 1500 nm), fast time response (e.g. <10 µs), and widely tunable spectral response. The PVFET shows a responsivity 5 orders of magnitude higher at 1500 nm wavelength than prior IR-sensitized silicon detectors. The sensitization is achieved using a room temperature solution process and does not rely on traditional high temperature epitaxial growth semiconductors, as per germanium and III-V compounds. Our results demonstrate, for the first time, colloidal quantum dots as an efficient platform for silicon based infrared detection.

In an embodiment, a photodetector may be provided that uses the photovoltage generated at a silicon:quantum dot heterointerface to detect electromagnetic radiation at one or more discrete wavelengths. In the embodiment, a quantum dot layer for receiving the electromagnetic radiation is provided and a silicon transport layer that changes in conductivity when the quantum dot layer received electromagnetic radiation at the one or more discrete wavelengths. In an aspect, the quantum dot layer including quantum dots sensitive to electromagnetic radiation at a discrete wavelength. In an aspect, the quantum dot layer including quantum dots sensitive to electromagnetic radiation at two or more discrete wavelengths. In an aspect, the quantum dot layer including quantum dots sensitive to electromagnetic radiation at one or more discrete wavelengths that are different from the wavelengths detectable by the silicon.

BRIEF DESCRIPTION OF THE FIGURES

Further features and advantages will become apparent from the following detailed description, taken in combination with the appended drawings, in which.

It will be noted that throughout the appended drawings, like features are identified by like reference numerals.

DETAILED DESCRIPTION

Embodiments of the present application are related to the combination of a nano-semiconductor sensitizing medium, and a mono-crystalline transport channel. Specific worked examples are provided employing a colloidal quantum dot sensitizing medium. The examples of a CQD sensitizing medium are by way of example only and intended to be non-limiting. Use of other polycrystalline and/or nano-semiconductors, including quantum dots more generally, as a sensitizing medium is contemplated. The present invention is intended to be defined by the scope of the appended claims, and their equivalents.

In the application the term "light" is used as descriptive of a particular embodiment, and is not intended to limit the invention to visible light. The invention contemplates implementation at other wavelengths of electromagnetic radiation, including without limitation near infrared, far infrared, ultraviolet, x-rays, etc., based on the band gap(s) of the sensitizing medium.

Figure 1:
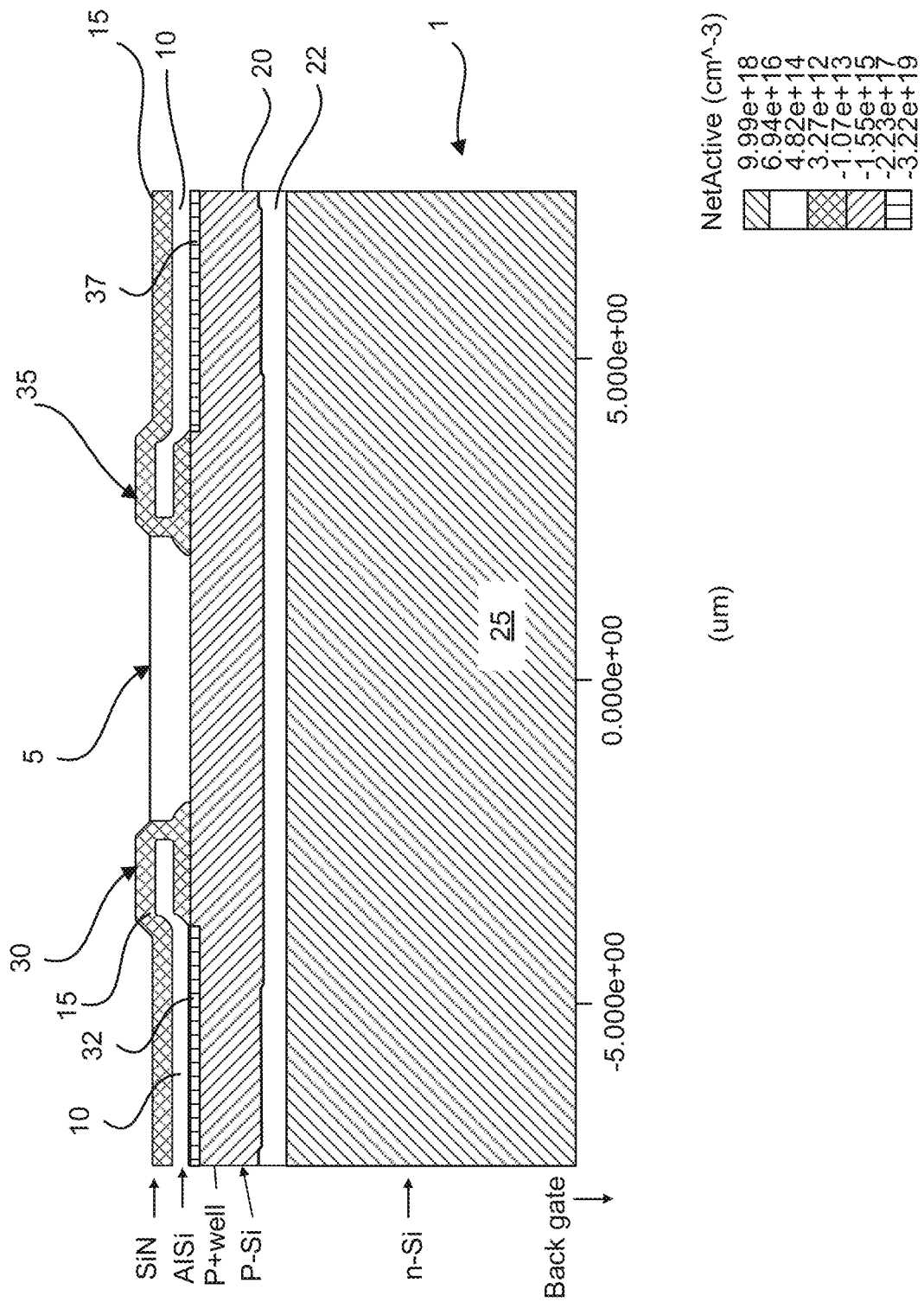
FIG. 1 is a cross-section drawing illustrating an embodiment of a PVFET.

FIG. 1 illustrates a representative doping profile and structure of a novel photodetector 1 in the form of a photovoltage-modulated field effect transistor (PVFET). The photodetector is comprised of a sensitizing medium 5, transport channel 20, substrate semiconductor (gate) 25, source 30, drain 35 that was constructed for experimental verification of an embodiment of a photodetector. The transport channel 20 being of a first dopant type and sandwiched between the substrate semiconductor (gate) 25 and the sensitizing medium 5 which are of a second dopant type. In the embodiment, the transport channel 20 supports, and is in contact with, the sensitizing medium 5, a positive contact 32, and a negative contact 37. In this example, the substrate semiconductor 25 and the sensitizing medium 5 are doped n-type and the transport channel 20 is doped p-type. As will be appreciated, in other embodiments, the substrate semiconductor 25 and the sensitizing medium 5 may be doped p-type and the transport channel 20 doped n-type A transition layer 22 separates the n-type substrate 25 and the p-type transport channel 20. As will be appreciated, FIG. 1 is a simplified sketch of a doping profile, and in practice the doping concentrations will smoothly vary from n-type to p-type with the transition layer 22 demarking the switch from n-type to p-type.

In this example, representative activity levels are indicated in the legend, but are not intended to be limiting. In this example, the gate 25 comprises an n-type silicon semiconductor and the transport channel 20 comprises a p-type silicon semiconductor. The metal 10 contacts are Aluminum Silicon (AlSi), and the insulating layers 15 are silicon nitride (SiN). As indicated above, other known semiconductor materials may be used.

A positive contact 32 provides electrical contact between the transport channel 20 and the source 30. A negative contact 37 provides electrical contact between the transport channel 20 and the drain 35. The positive contact 32 and the negative contact 37 at opposed ends of the transport channel 20 and bracketing the sensitizing medium 5. As a result, the transport channel 20 forms a semiconductor:semiconductor heterojunction with the sensitizing medium 5. In some embodiments, the sensitizing medium 5 may comprise at least one nano-semiconductor. In some embodiments, the sensitizing medium 5 may comprise at least one quantum dot. In some embodiments, the sensitizing medium 5 may comprise a monocrystalline structure, while the sensitizing medium 5 comprises a polycrystalline structure.

In the embodiment of FIG. 1, the photodetector 1 may be constructed to have a number of useful properties depending upon the selection of the sensitizing medium 5 and the transport channel 20. For instance, the sensitizing medium 5 may be selected to have beneficial optical properties differing from the optical properties of the underlying transport channel 20.

In some embodiments, the sensitizing medium 5 is adapted to receive electromagnetic radiation, such as light, creating a junction with the transport channel 20. The transport channel 20 adapted to exhibit a change in conductivity in response to reception of electromagnetic radiation by the sensitizing medium 5. In some implementations, the change in conductivity proportional to an amount of electromagnetic radiation received by the sensitizing medium 5.

In some embodiments, the sensitizing medium 5 may be selected to be sensitive to at least one different wavelength of electromagnetic radiation than the transport channel 20.

In some embodiments, the sensitizing medium 5 has a different bandgap than the transport channel 20.

In some embodiments, the sensitizing medium 5 has a different spectral sensitivity than the transport channel 20.

In some embodiments, the sensitizing medium 5 has a greater absorption coefficient than the transport channel 20 across one or more wavelengths of electromagnetic radiation. In some implementations, a sensitizing medium absorption coefficient of the sensitizing medium 5 is at least twice as large as a transport channel absorption coefficient of the transport channel 20. In some implementations, the sensitizing medium absorption coefficient is at least three times as large as the transport channel absorption coefficient. In some implementations, the sensitizing medium absorption coefficient is at least five times as large as the transport channel absorption coefficient.

In some embodiments, the sensitizing medium 5 has a greater sensitizing medium absorption coefficient at lower wavelengths of electromagnetic radiation than a transport channel absorption coefficient of the transport channel 20.

In some embodiments, the sensitizing medium 5 has a greater absorption coefficient at higher wavelengths of electromagnetic radiation than a transport channel absorption coefficient of the transport channel 20.

In some embodiments, the sensitizing medium is a solid film that includes at least one semiconductor quantum dot.

In some embodiments, the electron and/or hole mobility between the sensitizing medium 5 and the transport channel 20 (i.e. the electron and/or hole mobility across the semiconductor:semiconductor heterojunction) is low. In these embodiments, light falling on the sensitizing medium 5 modulates the built-in potential between the sensitizing medium 5 and the substrate 25, affecting the conductivity of the transport channel 20 between the positive contact 32 and the negative contact 37.

In some embodiments a bias is applied between the positive contact 32 and the negative contact 37, and wherein the conductivity of the transport channel may be measured by a current flowing between the positive contact 32 and the negative contact 37.

In some embodiments, the photodetector 1 may further include an integrator in electrical communication with at least one of the positive contact 32 and the negative contact 37. The integrator operative to integrate a current flowing between the positive contact 32 and the negative contact 37 over a time period. The integrated current flow produces a measurement of photogeneration rate in the sensitizing medium 5 over the time period.

In an embodiment a photodetector 1 in the form of a Si:CQD PVFET is presented wherein a sensitizing medium 5, such as a CQD layer, meets an underlying silicon-based gate 25, at a Si:CQD interface. The photodetector exploits a photovoltage arising at the Si:CQD interface to control junction electrostatics. As a result, light incident on the CQD layer modulates the conductivity of the silicon channel, and as a result the modulates the built-in potential between the sensitizing medium and the substrate, in proportion with the incident sub-silicon-bandgap electromagnetic radiation.

In an exemplary implementation, the sensitizing medium 5 comprises a CQD layer that may be selected such that the Si:CQD PVFET shows high responsivity in the IR (1300 nm and 1500 nm) in excess of $10^4$ A/W, has a response faster than 10 μs, and/or dark current densities of $10^{-1}$-$10^1$ A/cm$^2$ for $V_{GS}$=0-3 V.

Figure 2A:
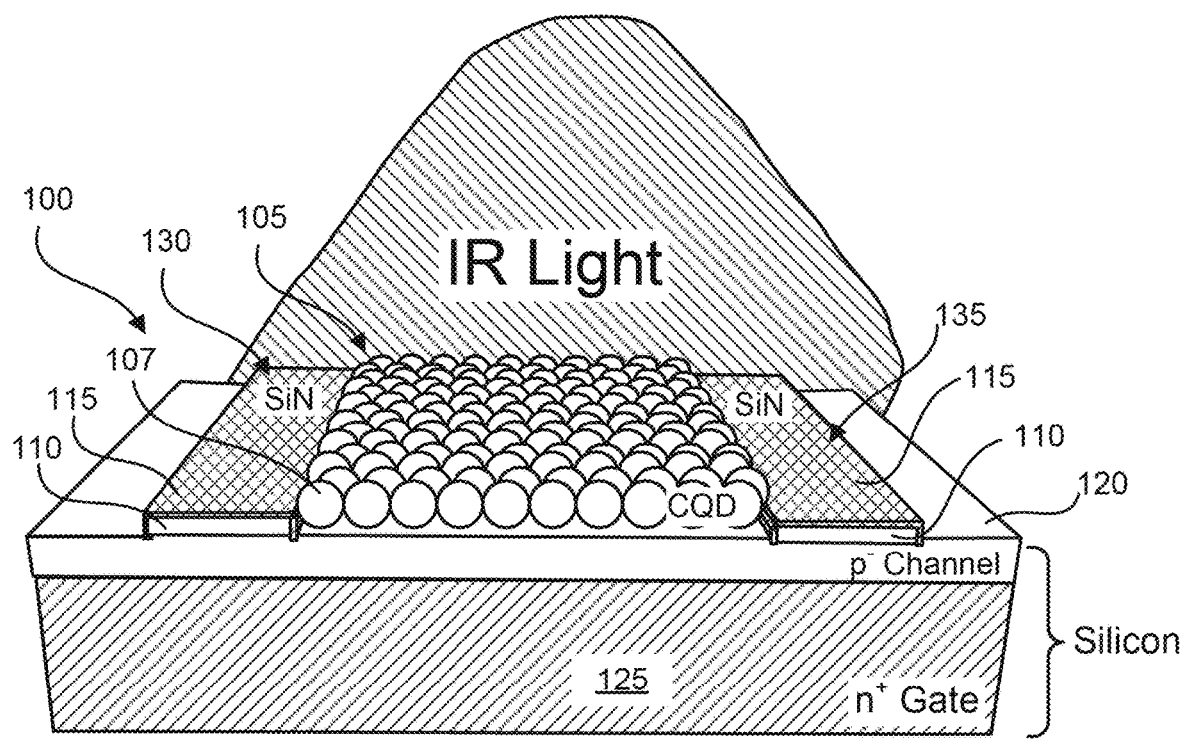
FIG. 2A is illustrates an embodiment of a three-dimensional model of a Si:CQD PVFET.

Referring to FIG. 2A, an embodiment of a three-dimensional model of photodetector 100 is illustrated. In the embodiment of FIG. 2A, the photodetector comprises a semiconductor:semiconductor heterojunction in electrical contact with a sensitizing medium. In the embodiment of FIG. 2A, a Si:CQD PVFET photodetector 100 is illustrated, wherein the sensitizing medium comprises a CQD layer 105. In the embodiment, a transport channel 120 in the form of a first dopant type (in this example a lightly p-type silicon channel) is epitaxially grown on a silicon substrate semiconductor of a second dopant type (in this example an n$^+$ silicon substrate semiconductor) that acts as a gate 125. The transport channel 120 is contacted with a source 130 and drain 135. The CQD layer 105 being of the same dopant type as the gate 125 (i.e. the second dopant type)

In the embodiment of FIG. 2A, the source 130 and drain 135 are each comprised of a metal contact 110 encapsulated with an insulating layer 115. For instance, the metal contact 110 may comprise aluminum, and the insulating layer 115 may comprise silicon nitride (SiN), though other metals and insulators known in semiconductor manufacturing may be used.

Referring back to FIG. 2A, the thin n-doped CQD layer 105 is deposited on top of the silicon transport channel 120, creating an IR-photosensitive gate. The source 130 and drain 130 may be coated with an insulating layer 115 to electrically isolate them from the CQD layer 105. In this embodiment, the source 130 and drain 135 were covered with a thick layer of insulating silicon nitride to prevent electrical contact between the photogate and the aluminum.

As will be appreciated, while in this exemplary embodiment a p-type transport channel 120 is sandwiched by an n-type substrate 125 and the n-type CQD layer 105, the converse construction is also contemplated, with an n-type transport channel sandwiched by a p-type substrate and a p-type CQD layer.

Attention to the means for deposition of the CQD layer 105 onto the Silicon-based transport channel 120 is important for efficient operation of the Si:CQD PVFET photodetector 100. The rectifying Si:CQD junction relies on passivating surface traps and providing energetic alignment between the two semiconductors. Accordingly, for optimum rectifying heterojunction efficiency, steps for heterointerface passivation should be taken during manufacture.

Figure 2B:
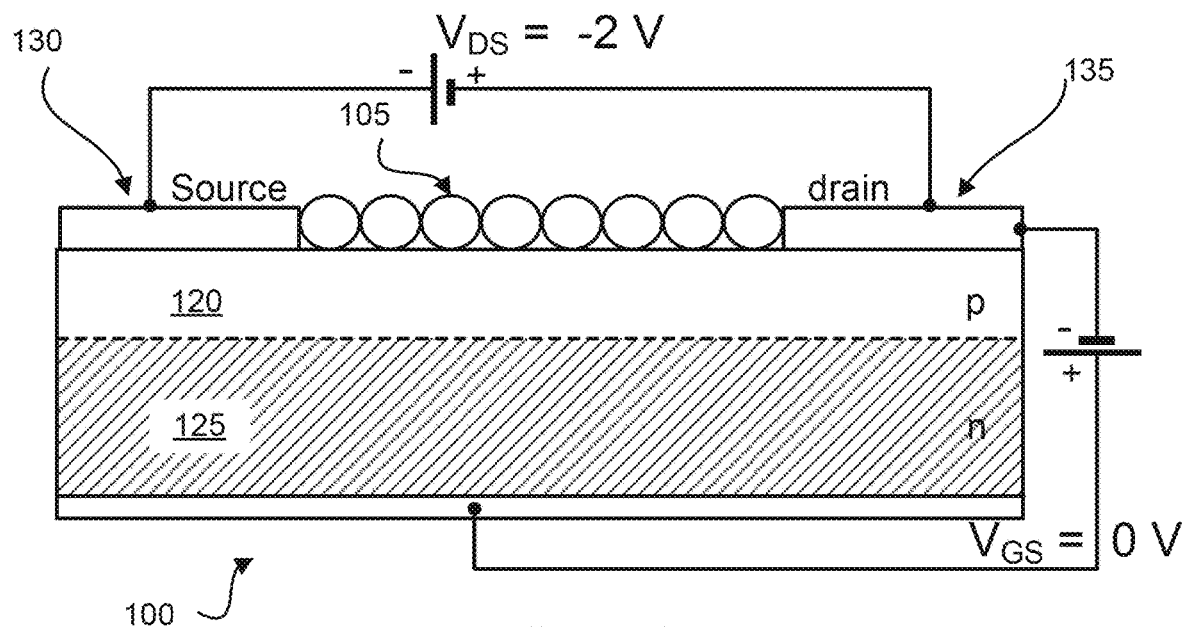
FIG. 2B is a side section view schematic of the model of FIG. 2A.

Referring to FIG. 2B, a simplified side section view schematic of the three-dimensional model of FIG. 2A is presented. In the aspect, a −2V bias between the source and drain is illustrated.

Figure 3A:
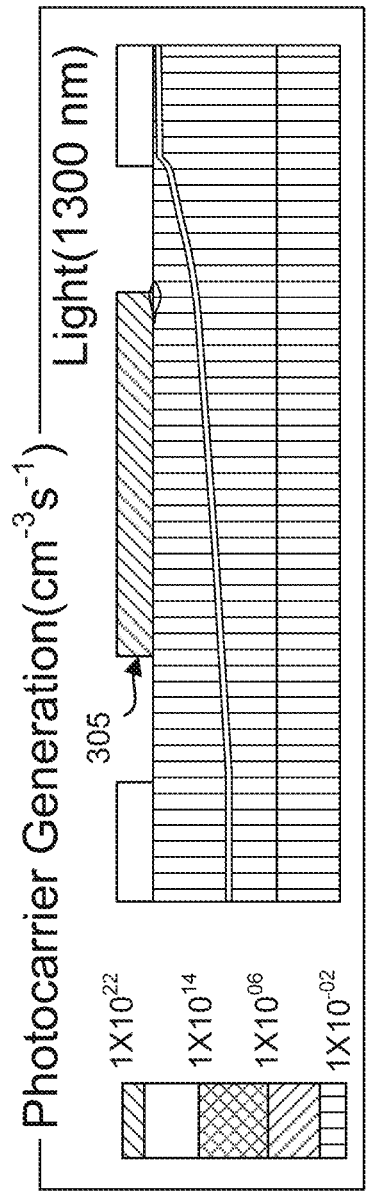
FIGS. 3A and 3B are side section view simulations of an embodiment of a PVFET.
Figure 3B:
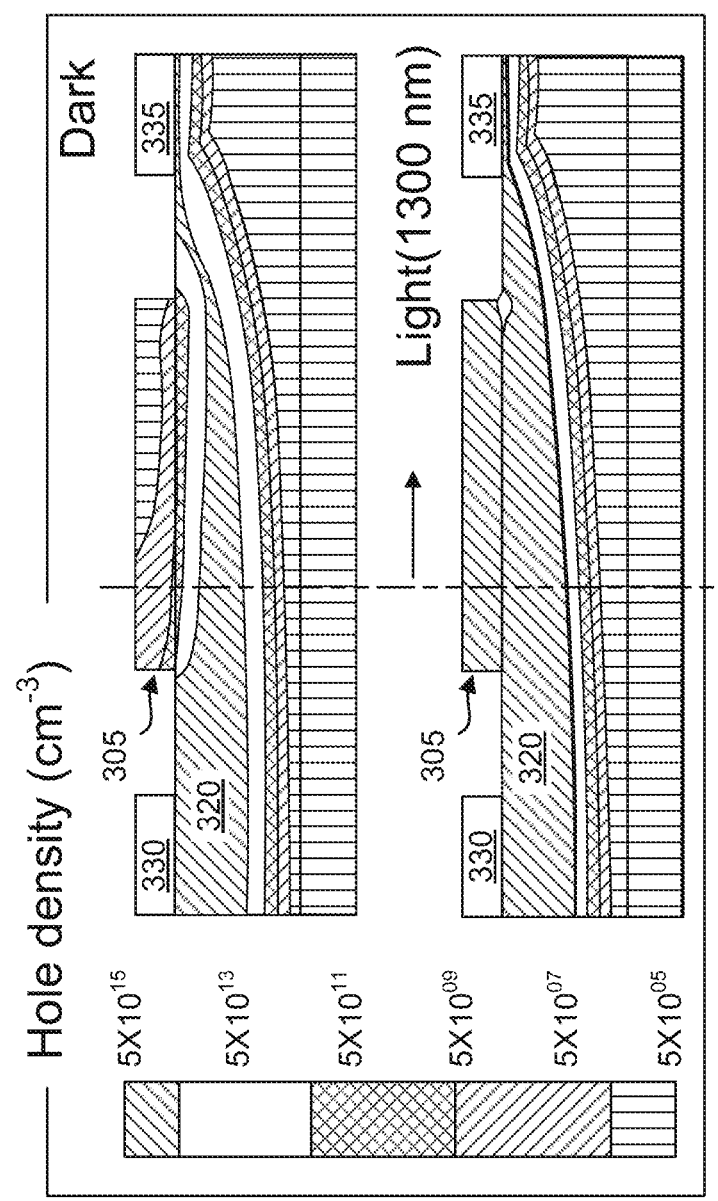

FIGS. 3A and 3B are side section view TCAD simulations of an embodiment of a PVFET that illustrate the working principles of the device. For this embodiment, upon optical illumination using 1300 nm incident radiation (FIG. 3A), photocarriers are generated exclusively within the CQD layer 305. The generation of photocarriers in the CQD layer 305 produces a photovoltage at the Si:CQD interface via the photovoltaic effect—the same effect that produces an open circuit voltage in solar cells though they employ a different structure—that modulates the built-in potential of the PVFET. In the PVFET, the modulation of the built-in potential by the photovoltage creates an effective bias that shrinks the depletion region and increases thereby the extent of the undepleted region in the transport channel.

FIG. 3B provides exemplary comparison illustrations comparing the density of holes (majority carriers) in the silicon transport channel both under dark conditions and under illumination with 1300 nm light. The light signal produces a photovoltage causing a shrinking of the depletion region within the silicon channel; this results in an increase of the hole density in an undepleted region 320 and therefore of the channel conductivity between the source 330 and the drain 335. The illustrations of FIG. 3B are based on the PVFET embodiment described above in FIG. 2A, where the example uses electromagnetic radiation in the form of 1300 nm light.

Figure 4A:
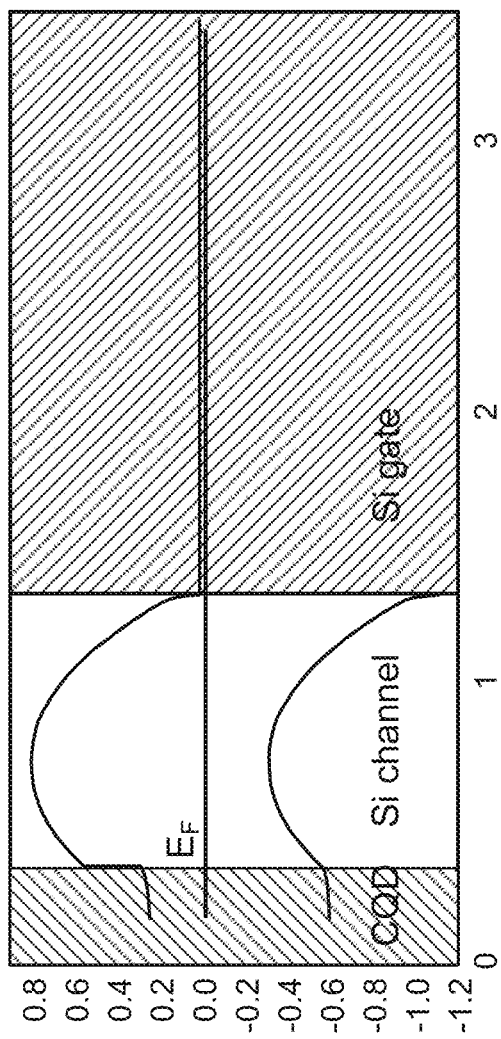
FIG. 4A is a plot illustrating a transverse energy band diagram of an embodiment of a PVFET.

FIG. 4A is a plot illustrating a transverse energy band diagram of an embodiment of a PVFET. In this embodiment, a thin (1.6 μm) silicon p-layer is sandwiched between two n-type rectifying junctions and is therefore depleted at equilibrium (in the dark). The FIG. 4A plot illustrates energy level (eV) across the depth (Y) of the exemplary PVFET embodiment under both dark conditions and under illumination with 1300 nm light.

Figure 4B:
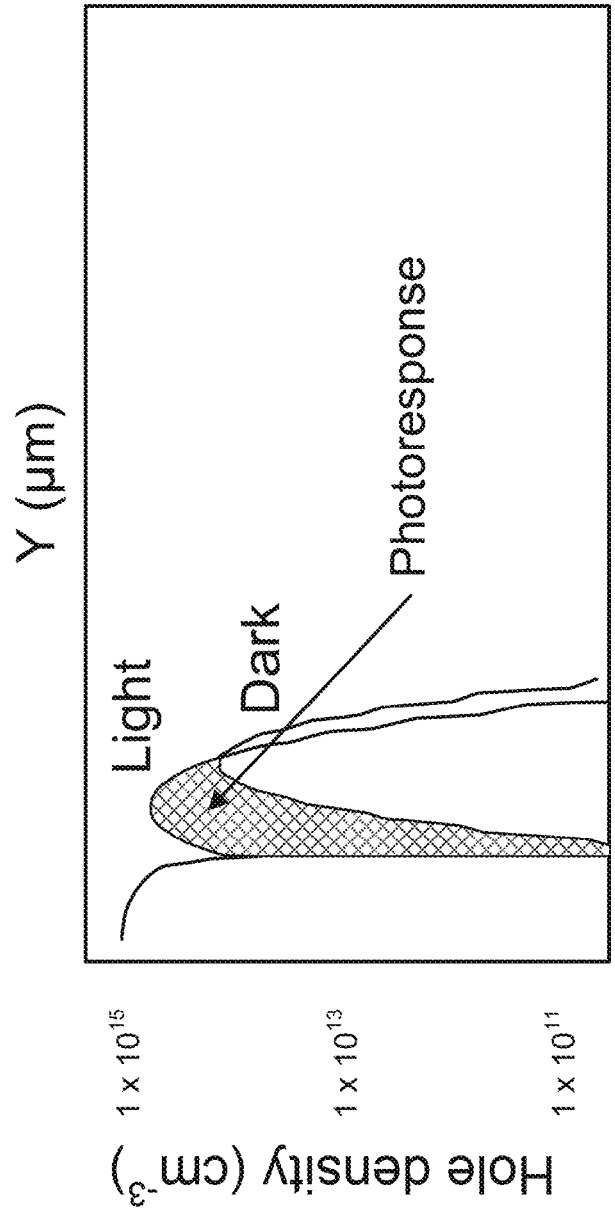
FIG. 4B is a plot illustrating hole density evaluated across the depth (Y) of the exemplary PVFET embodiment.

FIG. 4B is a plot illustrating hole density evaluated across the depth (Y) of the exemplary PVFET embodiment of FIG. 2A under both equilibrium (dark) conditions and under illumination with 1300 nm light. As illustrated, the hole density in the channel strongly increases under illumination compared to dark equilibrium.

In this application, the standard practice is followed of using the photosensitive area to calculate the current density and other figures of merit such as the detectivity D*. It is important to consider that in a (photo)FET, an additional linear-dimension scaling law is applicable: the dark current will scale as W/L (channel width/channel length), an important design parameter that also must be taken into account.

We analyze the operation of the PVFET to explain further the physical mechanisms governing its behavior and compare its performance with that of other photodetector architectures.

Figure 5A:
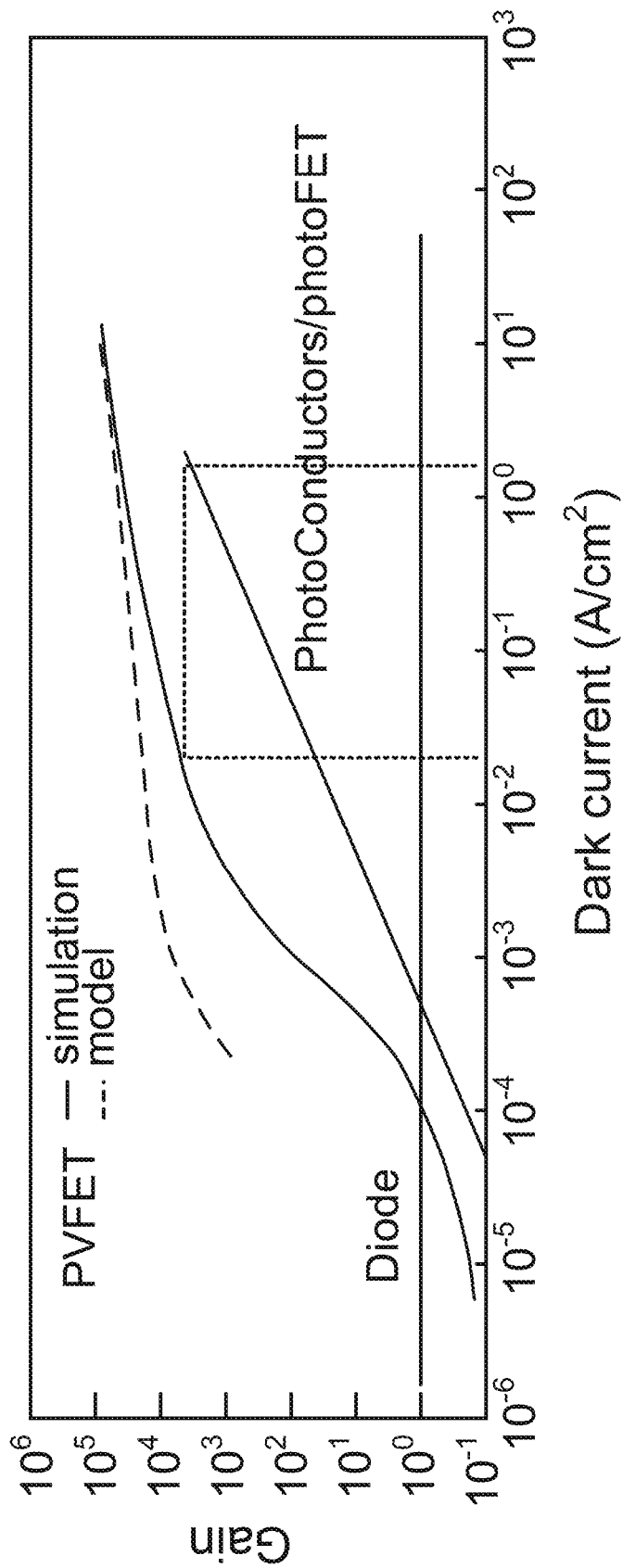
FIG. 5A is a plot of gain vs. dark current comparing the performance of the exemplary PVFET model to a simulation of the exemplary PVFET model.

FIG. 5A is a plot of gain vs. dark current comparing the performance of the exemplary PVFET of FIG. 2A using an analytical model (dashed line) as compared with a numerical TCAD simulation (solid line) of the exemplary PVFET. The gain as a function of the dark current for the PVFET, photodiodes, photoconductors and photoFETs are also presented for comparison purposes in FIG. 5A.

FIG. 5A was plotted based on the following model assumptions:
Photoconductors/PhotoFETs:
$V=(10^{-3}-10^3)$ V
$q=1.6\times 10^{-19}$
$N_A=10^{16}$ Cm$^{-3}$
$\mu=0.01$ cm$^2$/Vs (typical for a CQD solid)
$d=5\times 10^{-6}$ m (channel length)
$t=300\times 10^{-9}$ m (typical thickness of a CQD solid)
$W=10^{-3}$ m (channel width)
$\tau_l=10^{-4}$ S
$\rho=(q\times N_A \times \mu)^{-1}$
$\tau_t=d^2/(\mu \times V)$;
gain=$\tau_l/\tau_t$;
$I=V/(\rho \times d/(t\times W))$ (dark current)
PVFET:
$q=1.6\times 10^{-19}$ C
$\mu=6\times 10^2$ cm$^2$/Vs;
$K=1.38\times 10^{-23}$ m$^2$ kg s$^{-2}$ K$^{-1}$
T=300 K
$W=10^{-3}$ m;
$t=0.95\times 10^{-6}$ m
$d=5\times 10^{-6}$ m
$V_{bi}=1$ V (built-in voltage)
eps=$12\times 8.854\times 10^{-12}$ F/m
$N_A=[1, 1.5, 1.7, 2, 2.5, 2.7, 3, 3.5, 4]\times 10^{16}$ cm$^{-3}$
Io=$10^{-11}$ A (diode reverse saturation current)
$h=6.6\times 10^{-34}$ m$^2$ Kg/s
$f=2.3\times 10^{14}$ Hz (optical frequency)
$P_{opt}=10^{-4}\times W\times d$
$I_{ph}=q\times P/(h\times f)$;
$V_{ph}=(K\times T/q)\times \log(I_{ph}/Io+1)$
$V_{po}=q\times N_A\times t^2/(2\times eps)$ (pinch off voltage)
$Go=q\times N_A\times \mu \times t\times W/d$
$g_m=Go\times(1-(V_{bi}/V_{po})^{1/2})$
Gain=$h\nu/q\times g_m\times V_{ph}/P_{opt}$ $I_{dark}$ was calculated with Synopsys Sentaurus, using the same parameters used in this model.

Photoconductors and photoFETs (i.e. previously-developed CQD based phototransistors) are treated together since the gain mechanism governing these devices is the same: trap-assisted photoconductivity. Diodes do not produce gain, as illustrated by the horizontal line in FIG. 5A. Photoconductors and photoFETs based on trap-assisted photoconductivity have a linear relation between gain and dark current ($I_D$): photoconductive gain=$\tau_l/\tau_t$ where $\tau_l$ is the trap lifetime and $\tau_t$ the transit time within the channel. The gain can be increased by decreasing the transit time, i.e. by using a high mobility channel (e.g. graphene); however, this increases $I_D$.

In a PVFET, gain is adjusted by tuning the doping of the Silicon-based channel. The effect of the gate allows high gain at low dark currents. The gain produced by the PVFET is $h\nu/q\times V_{ph}\times g_m/P_{opt}$ where h is the Planck constant, ν the optical frequency, q the elemental charge, $V_{ph}$ is the photovoltage, $P_{opt}$ the incident optical power, and $g_m$ the transconductance of the PVFET defined as $$g_m = \frac{dI_{DS}}{dV_{ph}}.$$

This analytical model has been compared to fully self-consistent numerical simulations (TCAD) and found good agreement especially at high current. As illustrated in FIG. 5A, however, the analytical model does not accurately capture the subthreshold regime as there is a divergence between the simulation and the model.

Figure 5B:
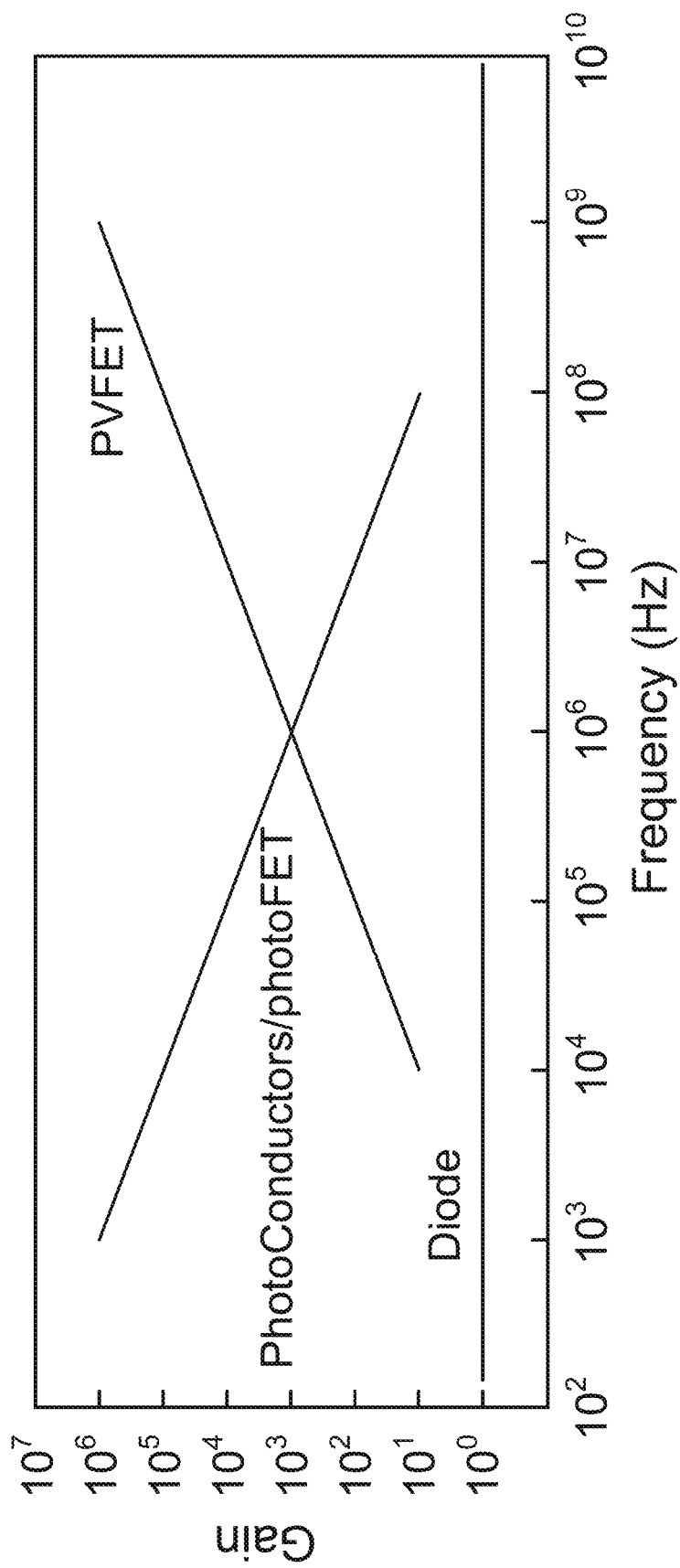
FIG. 5B is a plot of the Gain×BW product for diodes, photoFETs (CQD based), photoconductors (CQD based) and the embodiment of the PVFET.

Referring to FIG. 5B, a plot of gain vs. frequency (bandwidth—"BW") is presented comparing performance of photoFETs with PVFETs and diodes. While in photoconductors/photoFETs response time is increased at the expense of gain, for the PVFET gain and frequency are directly proportional.

FIG. 5B was plotted based on the following model assumptions:
Photoconductors/PhotoFETs:
gain=$\tau_l/\tau_t$
frequency=$1/\tau_l$
$\tau_t=10^{-9}$ s (transit time=$d^2/V\mu$ with d=5 μm, V=1 V, μ=250 cm²/Vs)
$\tau_l=(10^{-8}\text{-}10^{-3})$ s
PVFET:
gain=$h\nu/q \times g_m \times V_{ph}/P_{opt}$
$g_m=(10^{-7}\text{-}10^{-2})$ ohm$^{-1}$
$V_{ph}$=0.5 V
$C_{TOT}=10^{-11}$ F (junction capacitance for $N_A=5\times10^5$ cm$^{-3}$, $N_D=10^{19}$ cm$^{-3}$, electrical area=35 μm)

The gain based on photovoltage and transconductance is distinct from photoconductive gain. It enables simultaneously high signal amplification and rapid response. While photoconductors and photoFETs are limited in speed by $\tau_l$, and rely on traps to produce gain, the bandwidth of the PVFET is instead determined by the total capacitance, resulting in a bandwidth f=$g_m/C_{TOT}$. As can be seen in FIG. 5B, while gain is generated in photoconductors/photoFET at the expense of speed (CQD photoFETs are typically limited to a response time in the range 0.001-1 s due to the required high values of $\tau_l$), in the PVFET, high gain (high $g_m$) leads to a rapid response time.

Figure 5C:
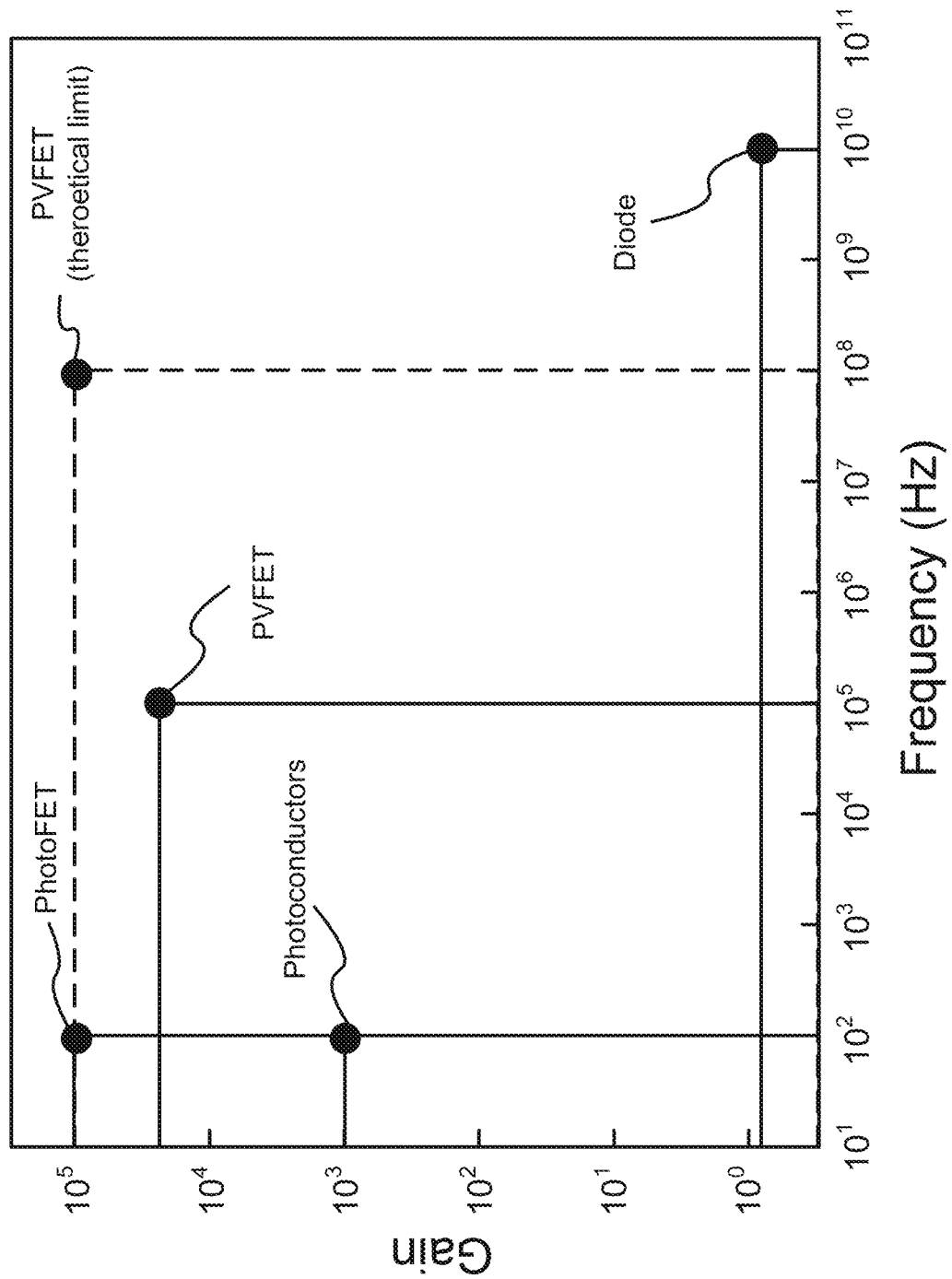
FIG. 5c is a plot of gain vs. frequency (bandwidth) is presented comparing performance of photoFETs with PVFETs and diodes.

This gain mechanism allows for a large gain×bandwidth product. Referring to FIG. 5C, a plot of the Gain×BW product for diodes, photoFETs (CQD based), photoconductors (CQD based) and the embodiment of the PVFET is presented. Experimental results and theoretical limit are reported for the Si:CQD PVFET as shown in FIG. 5C. The inventors have observed experimentally a gain×bandwidth product of $10^4 \times 10^5$ l/s and we show in FIG. 5B, using the model of gain and bandwidth described above, that this value can in principle be further increased towards $10^5 \times 10^8$ l/s.

Figure 6A:
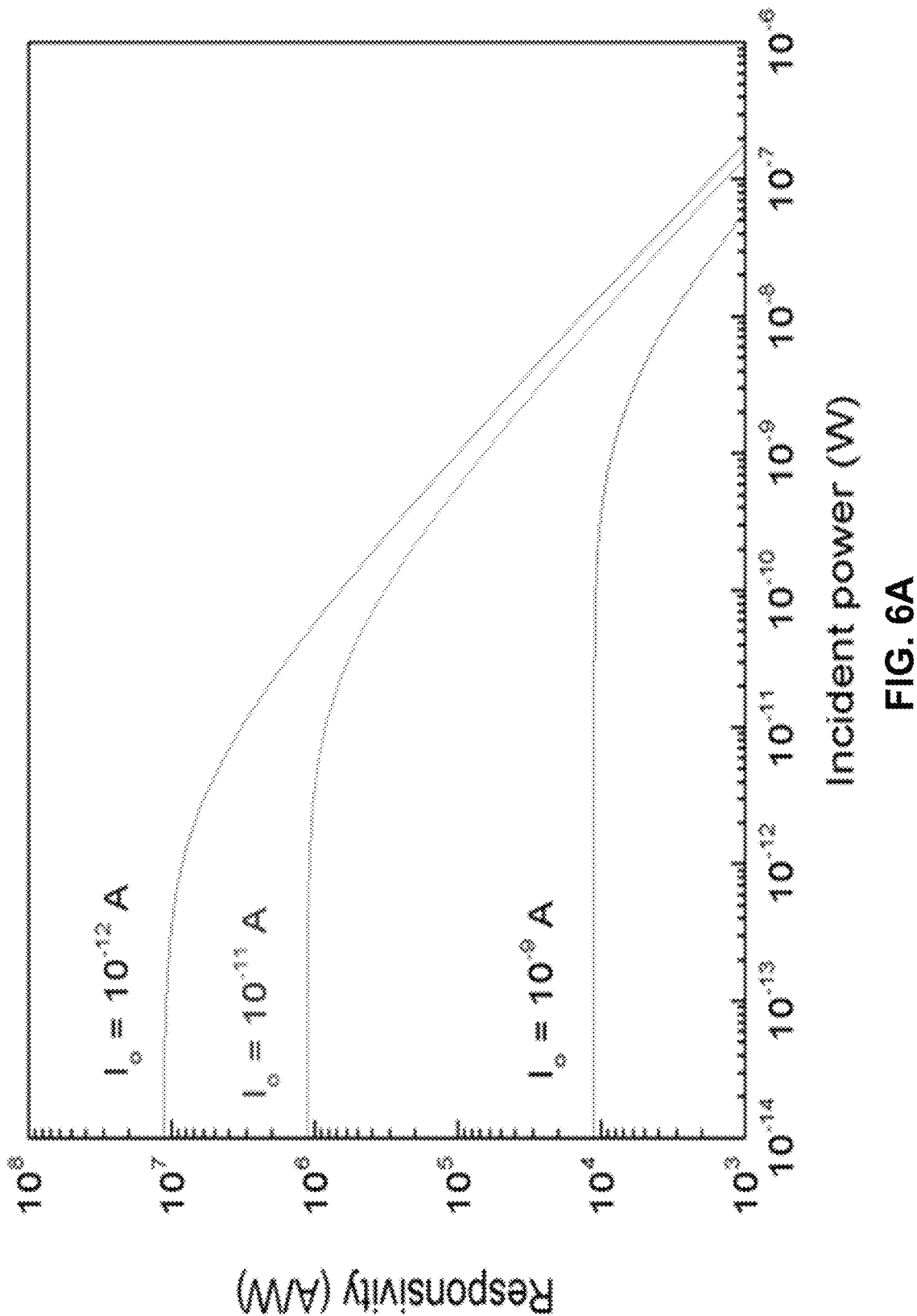
FIG. 6A shows plots of responsivity for different values of reverse saturation.
Figure 6B:
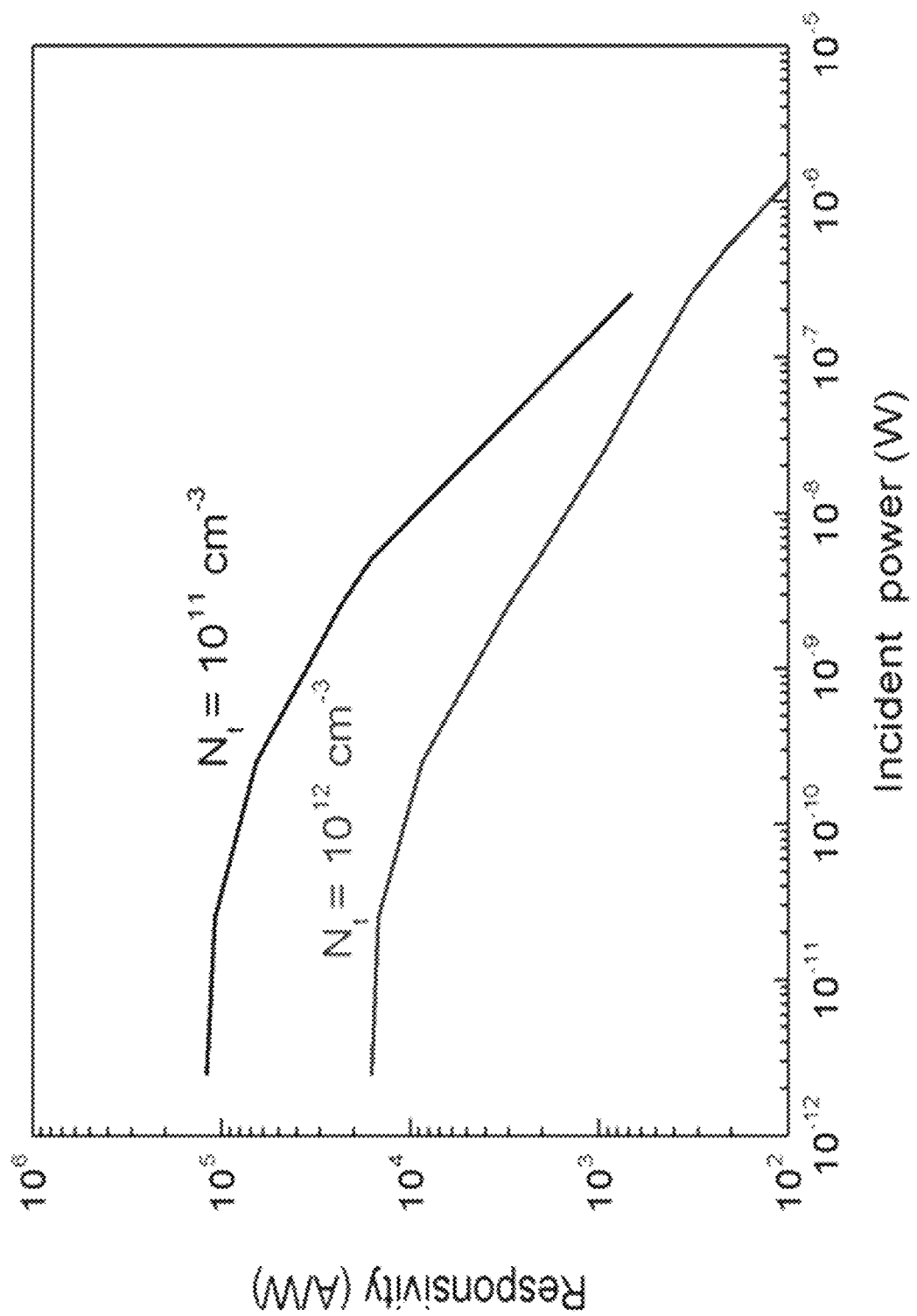
FIG. 6B shows plots of responsivity for different numbers of traps.

The performance of the PVFET depends strongly on the quality of the Si:CQD rectifying junction and ultimately the quality of the heterointerface that needs to be, ideally, free from traps and defects. The impact of interface traps on the responsivity of the PVFET is demonstrated in FIGS. 6A and 6B using TCAD Sentaurus device simulations. FIG. 6A is a plot illustrating responsivity (using the above analytical model) for different values of the reverse saturation current of the Si:CQD heterointerface Io. Decreasing Io, i.e. improving the rectification factor of the junction, increases the responsivity by 3 orders of magnitude. FIG. 6B is a plot illustrating responsivity of the PVFET generated from Sentaurus device simulations. In the simulations of FIG. 6B, traps are introduced (Nt, the traps are acceptors located at 0.2 from the mid-gap 2) at the Si:CQD interface and the gain calculated. Consistent with FIG. 6A the responsivity is sensitive to the number of interface traps.

The photovoltage arising at the heterojunction interface is determined—as in a solar cell that also relies on the photovoltaic effect—by the rectification ratio of the junction. Accordingly, it is important to minimize the reverse saturation current of the junction.

Figure 6D:
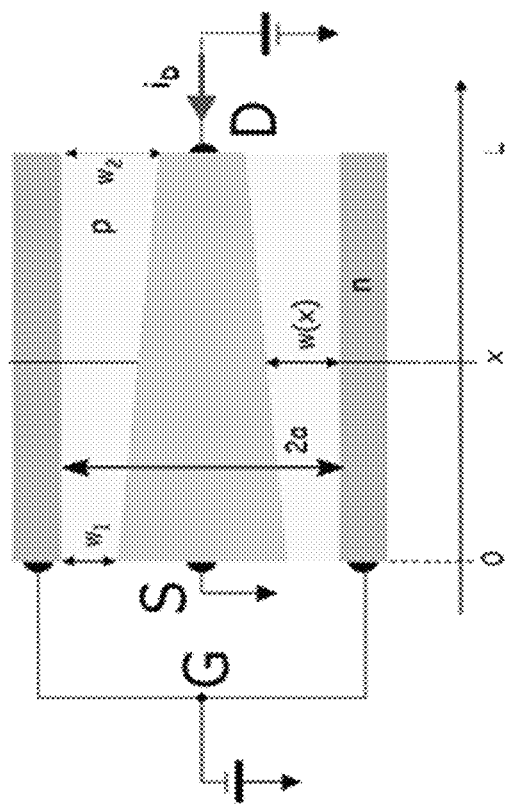
FIGS. 6C and 6D are schematics illustrating variables used in an analytical model.
Figure 6C:
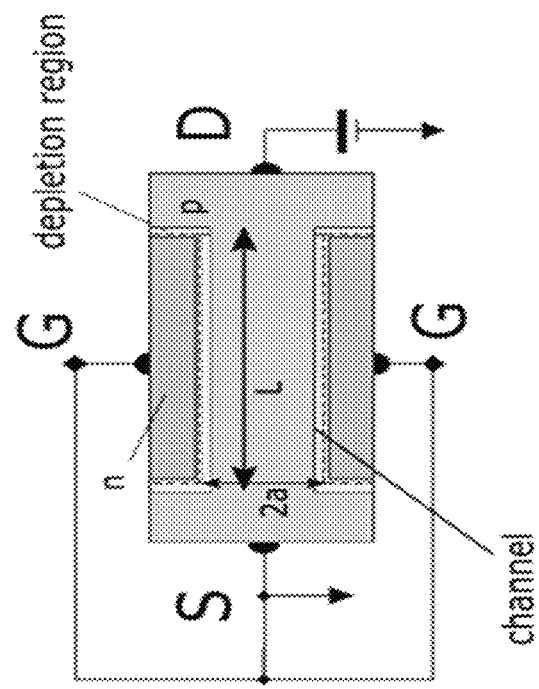

Referring to FIG. 6C, the dark response of a PVFET may be analytically modelled (electrically a JFET).

With $V_{DS} \to 0$ (much smaller than the pinch-off voltage) we will have:
The conductance in the channel is:

$$G = q\mu N_A \frac{2(a-w)Z}{L}$$

where w is the extent of the depletion region. $I_{DS}$ can therefore be written as:

$$I_{DS} = q\mu N_a \frac{2(a-w)Z}{L} V_{DS}$$

where the expression for the depletion region is:

$$w = \left[\frac{2\varepsilon_s}{qN_A}(V_{bi} - V_a)\right]^{1/2}$$

$V_a$ is the bias applied to the junction, i.e. $V_{GS}$. We therefore obtain:

$$I_{DS} = G_o V_{DS}\left\{1 - \frac{1}{a}\left[\frac{2\varepsilon_s}{qN_A}(V_{bi} - V_{GS})^{1/2}\right]\right\}$$

with $$G_o = q\mu N_A \frac{2aZ}{L}.$$

At the threshold voltage can write:

$$V_{bi} - V_T = V_{po}$$

$$\frac{2\varepsilon_s}{qN_A} V_{po} = a^2 \to V_{po} = \frac{qN_A a^2}{2\varepsilon_s}$$

where $V_{po}$ is the pinch-off voltage.

Referring to FIG. 6D, a more realistic picture of the device takes in account for the effect of the $V_{DS}$, so that the w changes with the x coordinate (i.e. w(x)):

The channel resistance will be therefore:

$$R = \frac{1}{2q\mu N_A}\frac{x}{Z(a-w(x))} \to dR = \frac{1}{2q\mu N_A}\frac{dx}{Z(a-w(x))}$$

We can therefore write $$dV = \frac{1}{2q\mu N_A}\frac{I_D dx}{Z(a-w(x))} \to I_D dx = 2q\mu N_A Z[a-w(x)]dV$$

since:

$$w(x) = \left[\frac{2\varepsilon_s}{qN_A}(V_{bi} - (V_{GS} - V_X))\right]^{1/2}$$

$$dw = \frac{1}{2}\left[\frac{2\varepsilon_s}{qN_A}(V_{bi} - (V_{GS} - V_X))\right]^{-1/2} \cdot \frac{2\varepsilon_s}{qN_A} dV =$$

$$\frac{\varepsilon_s dV}{qN_A w(x)} \to dV = \frac{qN_A w(x) dw}{\varepsilon_s}$$

Substituting into the previous equation:

$$I_D dx = \frac{2q^2\mu N_A^2 Z}{\varepsilon_s}[aw(x) - w^2(x)]dw$$

Integrating this expression between 0 and L using the following conditions:

$$\begin{cases} w_1^2 = \frac{2\varepsilon_s}{qN_A}(V_{bi} - V_{GS}) \\ w_2^2 = \frac{2\varepsilon_s}{qN_A}(V_{bi} - (V_{GS} - V_{DS})) \end{cases}$$

we obtain:

$$I_D = \frac{2q^2\mu N_A^2 Z}{\varepsilon_s L}\left\{\frac{a}{2}\frac{2\varepsilon_s}{qN_A}V_{DS} - \frac{1}{3}\left(\left[\frac{2\varepsilon_s}{qN_A}(V_{bi}-(V_{GS}-V_{DS}))\right]^{3/2} - \left[\frac{2\varepsilon_s}{qN_A}(V_{bi}-V_{GS})\right]^{3/2}\right)\right\}$$

being $$V_{po} = \frac{qN_A a^2}{2\varepsilon_s} \rightarrow \frac{a^2}{V_{po}} = \frac{2\varepsilon_s}{qN_A}$$

$$I_D = \frac{q^2\mu N_A^2 a^3 Z}{\varepsilon_s L}\left\{\frac{V_{DS}}{V_{po}} - \frac{2}{3}\left(\frac{[(V_{bi}-(V_{GS}-V_{DS}))]^{3/2}}{V_{po}} - \frac{[(V_{bi}-V_{GS})]^{3/2}}{V_{po}}\right)\right\}$$

defining $$I_{po} = \frac{q^2\mu N_A^2 a^3 Z}{3\varepsilon_s L}$$

and $$\frac{3I_{po}}{V_{po}} = Go = 2aq\mu N_A \frac{Z}{L}$$

we have $$I_D = Go\left\{V_{DS} - \frac{2}{3\sqrt{V_{po}}}\left([(V_{bi}-(V_{GS}-V_{DS}))]^{3/2} - [(V_{bi}-V_{GS})]^{3/2}\right)\right\}$$

that is valid for $$\begin{cases} 0 \leq |V_{GS}| \leq V_{po} \\ 0 \leq |V_{DS}| \leq V_{DS(Sat)} \end{cases}$$

finally for $$V_{DS} = V_{DS(Sat)} = (V_{po} - V_{bi}) + V_{GS}$$

$$I_{D(Sat)} = I_{po}\left\{1 - 3\left(\frac{V_{bi}-V_{GS}}{V_{po}}\right)\left[1 - \frac{2}{3}\sqrt{\frac{V_{bi}-V_{GS}}{V_{po}}}\right]\right\}$$

By deriving the expression for $I_{DS}$ with respect to $V_{GS}$ and $V_{DS} \rightarrow 0$ we obtain $g_m$ in the linear region $$g_m(\text{linear}) = \frac{Go}{2}\frac{V_{DS}}{\sqrt{V_{po}(V_{bi}-V_{GS})}}$$

Using the expression for $I_{DS(Sat)}$ will lead to the expression for $g_m$ in the saturation region:

$$g_m(\text{Sat}) = Go\left(1 - \sqrt{\frac{V_{bi}-V_{GS}}{V_{po}}}\right)$$

The light response of the PVFET may be analytically modeled by evaluating the photovoltage $V_{ph}$ arising at the Si:CQD heterojunction. $V_{ph}$ is calculated as:

$$V_{ph} = \frac{kT}{q}\log\frac{I_{light}}{I_o}$$

where k is Boltzmann's constant, T the temperature, q the elemental charge, $I_{light}$ the photo current that would be produced at the junction and $I_o$ the reverse saturation current. The photocurrent of the PVFET is therefore:

$$I_{DS_{photo}} = g_m \times V_{ph}$$

The PVFET converts the photovoltage signal to a photocurrent through the transconductance that, in a junction transistor, also depends on the quality of the heterojunction. A highly rectifying, trap-free heterointerface must be engineered to produce efficient PVFETs. This approach distinguishes the device from previously-reported photoFETs based on CQDs: in these prior art devices, gain comes from trap-assisted photoconduction, i.e. the traps provided by the CQD film of a photoFET are responsible for long lifetime of photocarriers recirculating in a high mobility channel (e.g. graphene, $MoS_2$). This produces gain=$\tau_{t\_CQD}/\tau_{t\_channel}$ (CQD trap lifetime/charge transit time in the channel). Accordingly, photoFETs do not require a rectifying photogate and their gain arises from a photoconductive effect, as opposed to the transistor effect of a PVFET.

Experimental Example

Embodiments of Si:CQDs PVFETs were fabricated and their performance characterized.

Figure 7A:
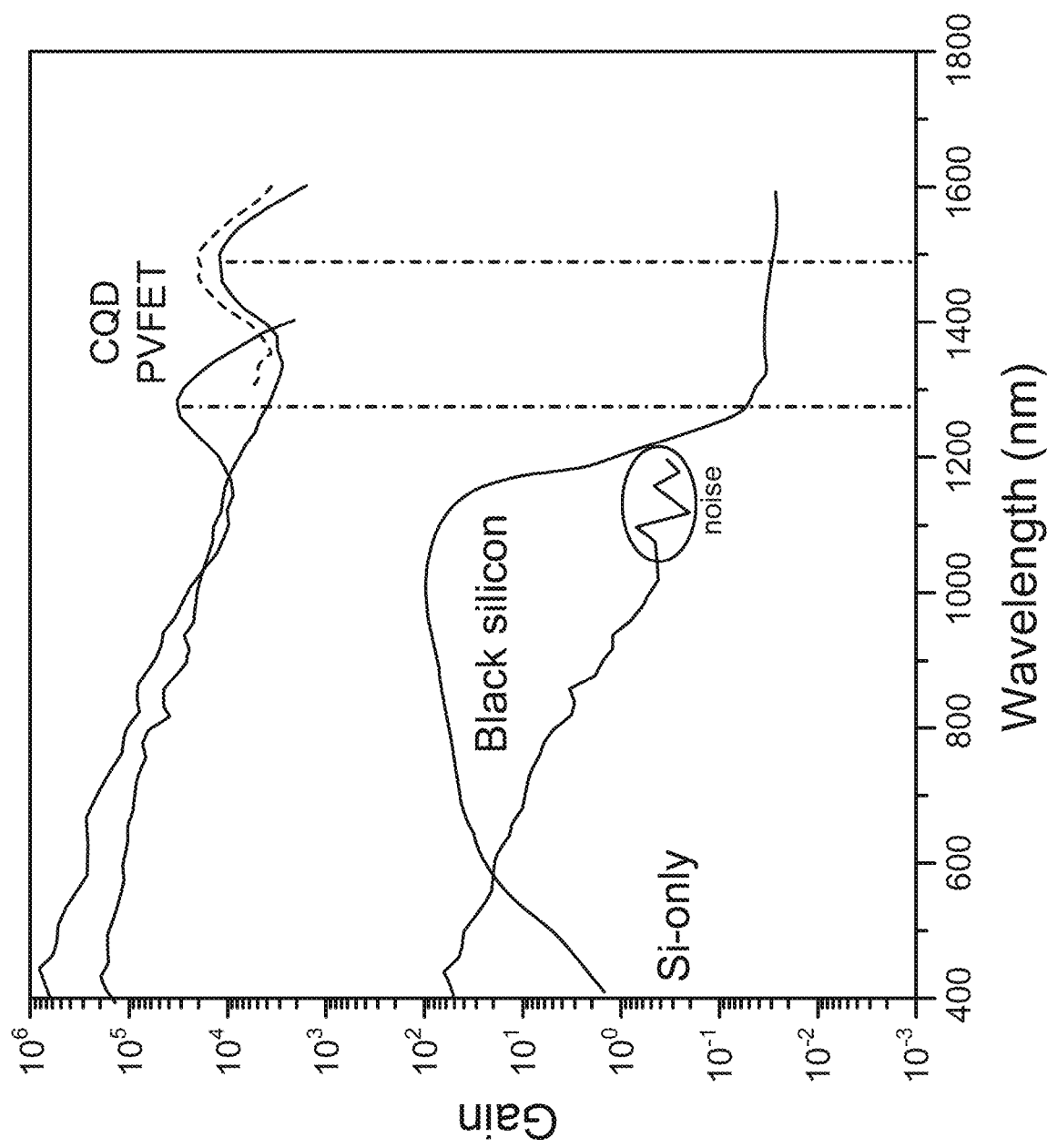
FIG. 7A is a plot of gain vs. wavelength comparing black Silicon photodetectors, Silicon photodetectors, and an embodiment of a PVFET.

FIG. 7A is a plot of gain as a function of incident light wavelength that illustrates the spectral response of a Si:CQD PVFET photodetector (for a photogate absorbing at 1300 and 1500 nm). The Si:CQD PVFET was biased with a $V_{GS}=0$ V and $V_{DS}=2$ V (solid line) and 3 V (dashed line). In the context of FIG. 7A, gain is defined as external quantum efficiency=photocarriers/incident photons. The fabricated embodiment of a PVFET produced a gain of ~6×10$^4$ at the exciton. The excitonic peak (either at 1300 and 1500 nm) is characteristic of the CQD solid and its energy is determined by the effect of quantum confinement, with greater spatial confinement increasing the effective bandgap of the CQD solid. FIG. 7A also includes plots for a Si-only PVFET (i.e. a photodetector with a silicon-based sensitizing medium, rather than CQD as the sensitizing medium) and also black silicon photodetectors for comparison. The sensitivity of the silicon-only PVFET vanishes beyond silicon's bandgap at 1100 nm. The gain of the CQD PVFET remains high due to the high absorption of the CQD photogate at these longer wavelengths. As indicated in FIG. 7A, the CQD PVFET embodiment has a 10$^5$ advantage in responsivity at IR wavelengths in comparison with black silicon photodetectors.

Figure 7B:
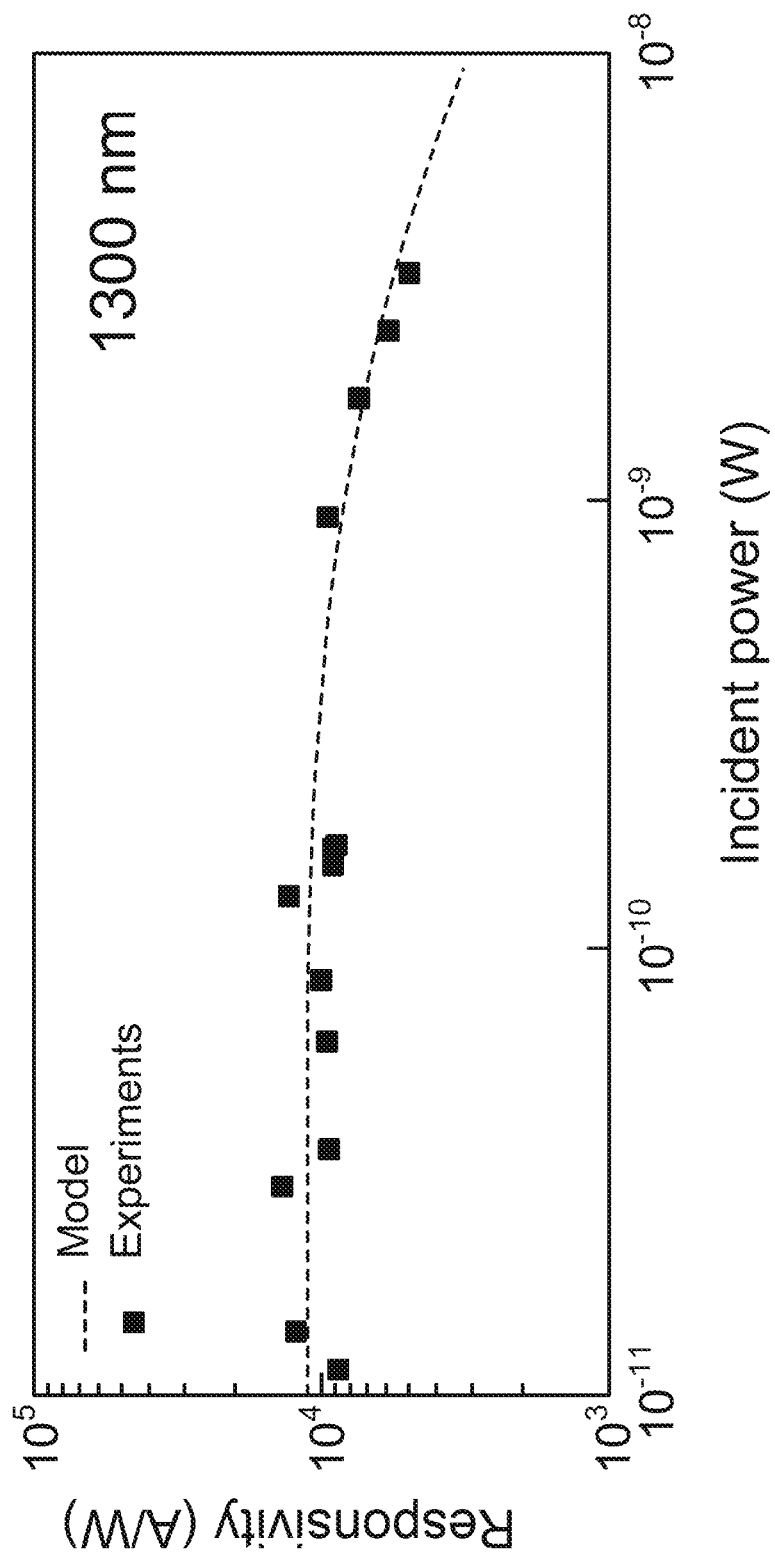
FIG. 7B is a plot of responsivity vs. incident power illustrating results for an analytical model of a PVFET as compared with experimental results.

FIG. 7B illustrates a PVFET responsivity at 1300 nm as a function of incident optical power. Experiment measurements (squares) were fit using an analytical model (dashed line) computing transconductive gain (gain=hv/q×$V_{ph}$×$g_m$/P).

The gain of $10^4$ at low intensity begins to roll off near ~2×$10^{-5}$ W/cm². FIG. 7B also includes the predicted model response based on the above analytical model in which the responsivity is calculated according to the formula Responsivity=$g_m$×$V_{ph}$/$P_{opt}$. As illustrated, the PVFET exhibits gain compression at high illumination, requiring offline nonlinearity correction, but also enabling increased dynamic range.

Figure 7C:
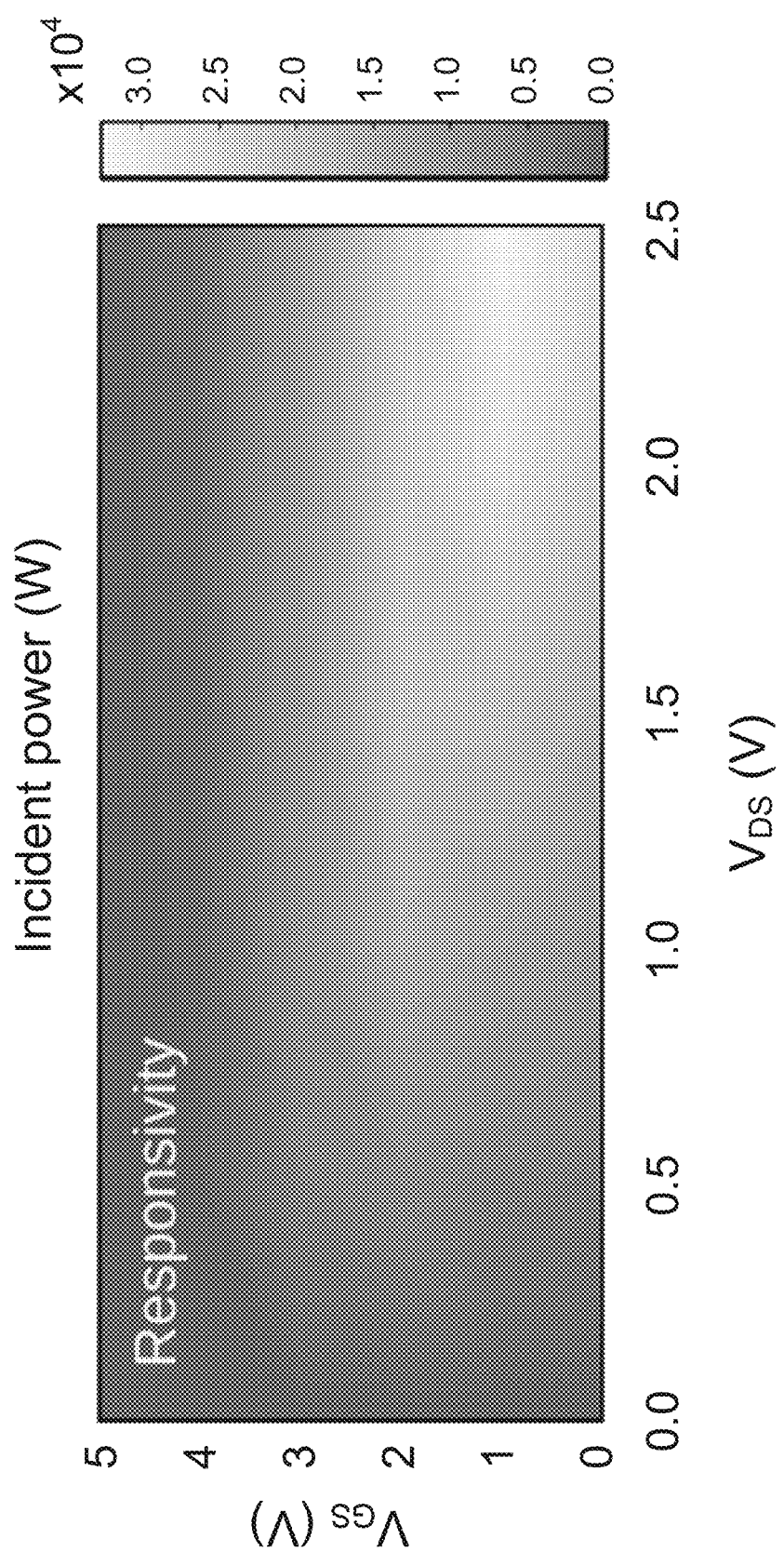
FIG. 7C is a heat map illustrating responsivity as a function of gate and drain-source bias.

FIG. 7C illustrates the responsivity of the PVFET under 1300 nm illumination as a function of $V_{GS}$ and $V_{DS}$ bias. Responsivity follows the same trend of $g_m$, saturating for $V_{DS}$ higher than the saturation voltage (~2 V) and vanishing at high $V_{GS}$ (closed channel). As illustrated, the responsivity saturates for $V_{GS}$>2 V, corresponding to the saturation voltage of the transistor (for voltages higher than the saturation voltage the transconductance $g_m$ remains constant), and vanishes for increasing gate voltages $V_{GS}$. Positive $V_{GS}$ closes the channel (full depletion), decreasing drastically $g_m$[20], $$g_m = G_o \left(1 - \sqrt{\frac{V_{GS} - V_{bi}}{V_{po}}}\right)$$

where $G_o$ is a constant of the device, $V_{bi}$ the built in voltage of the junction and $V_{po}$ the pinch-off voltage of the PVFET.

Figure 8A:
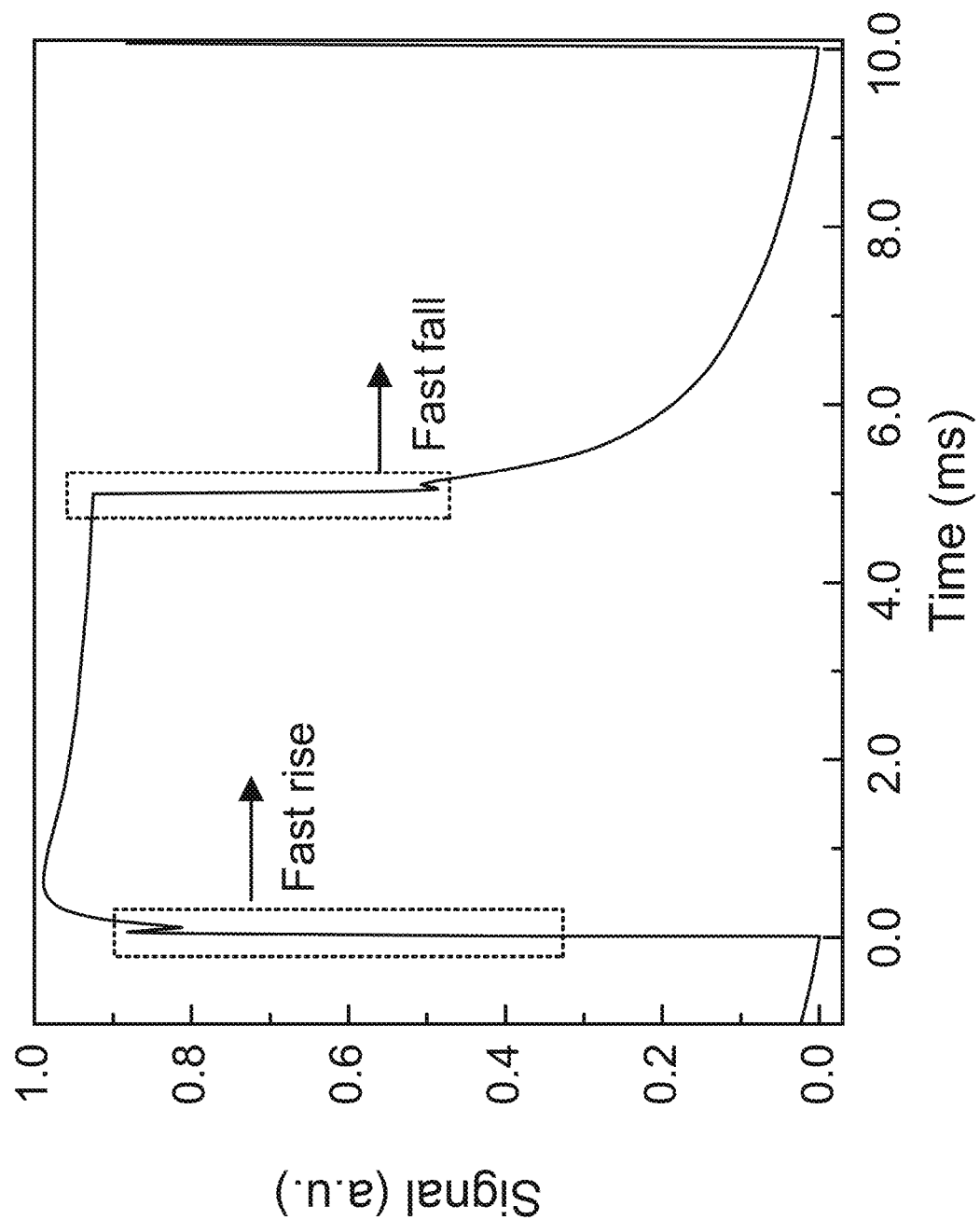
FIGS. 8A, 8B, and 8C are plots of signal vs. time illustrating response times for an embodiment of a PVFET.
Figure 8B:
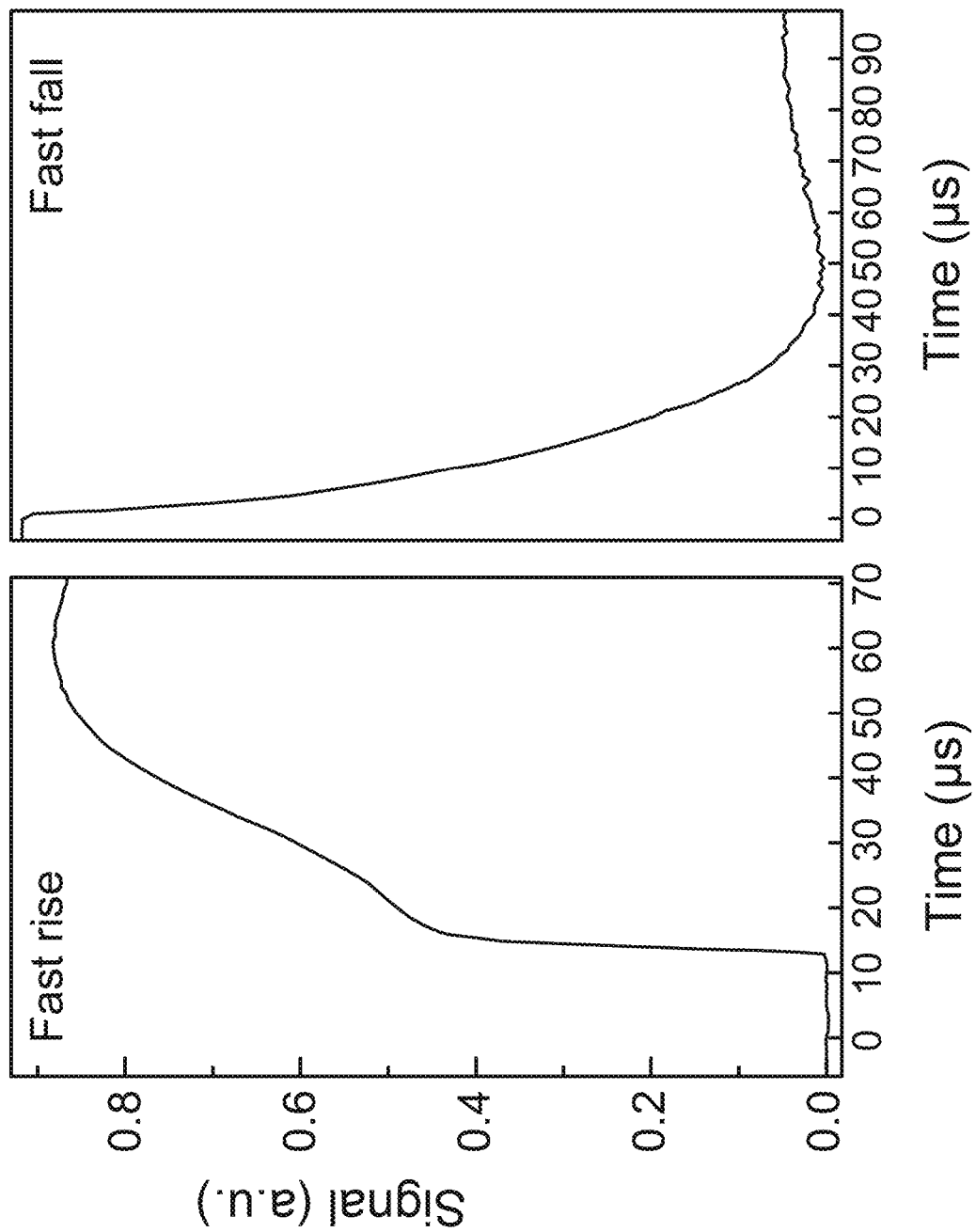

FIGS. 8A and 8B illustrate the response of the PVFET to a square wave input signal. The plots illustrate a fast (10 μs) fall and rise edge of the signal. This component of temporal response is compatible with sensing and imaging, addressing a wide range of consumer applications. The PVFET shows much faster response time than traditional CQD based photoconductors (~100 ms). A slower tail, attributable to defect states in the highly doped silicon substrates and the CQD bulk and interface, is also seen in the experimentally-fabricated PVFETs. Removing these electronic states could increase PVFETs in the direction of 1 GHz (the limit arising from $g_m$/$C_{TOT}$), competitive with photodiodes and enabling applications such as time-of-flight sensing and machine vision.

Figure 8C:
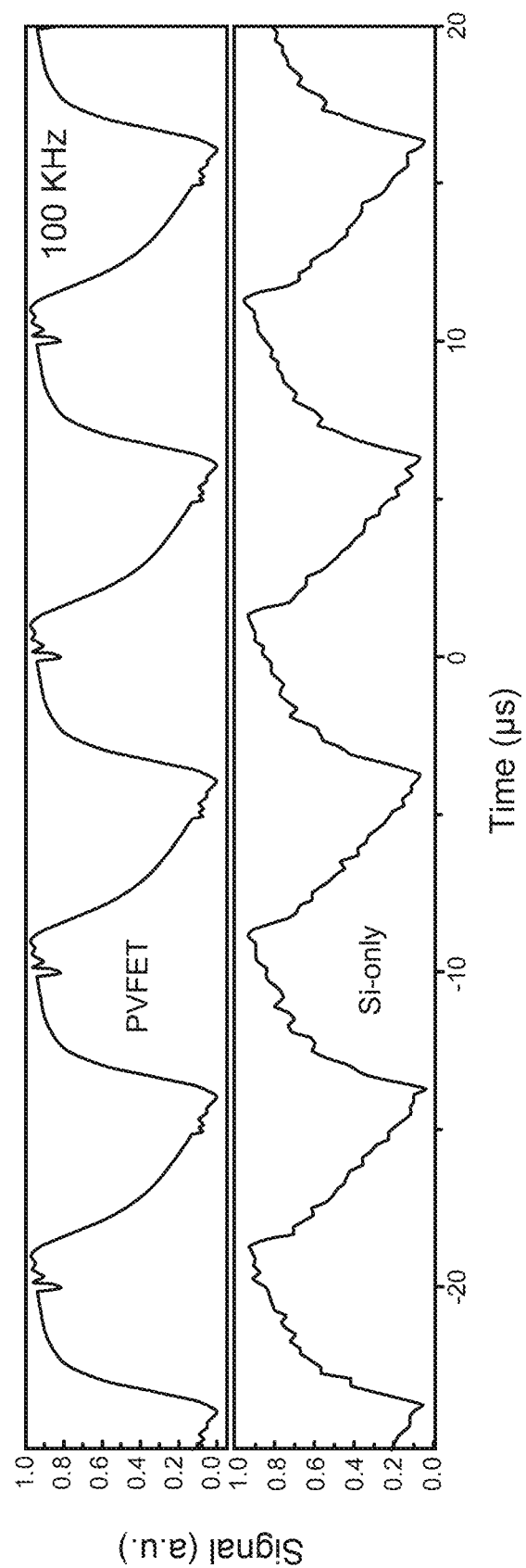

FIG. 8C are plots comparing signals acquired from the experimental Si:CQD PVFET and the silicon-only PVFET. The two waveforms representing the response to a 100 kHz excitation are similar, with the Si:CQD PVFET presenting slightly sharper edges. Notably, the addition of the CQD layer does not affect the transient response of the silicon device: it preserves its original speed, consistent with the fact that the PVFET gain mechanism does not rely on a memory effect from traps.

Figure 9A:
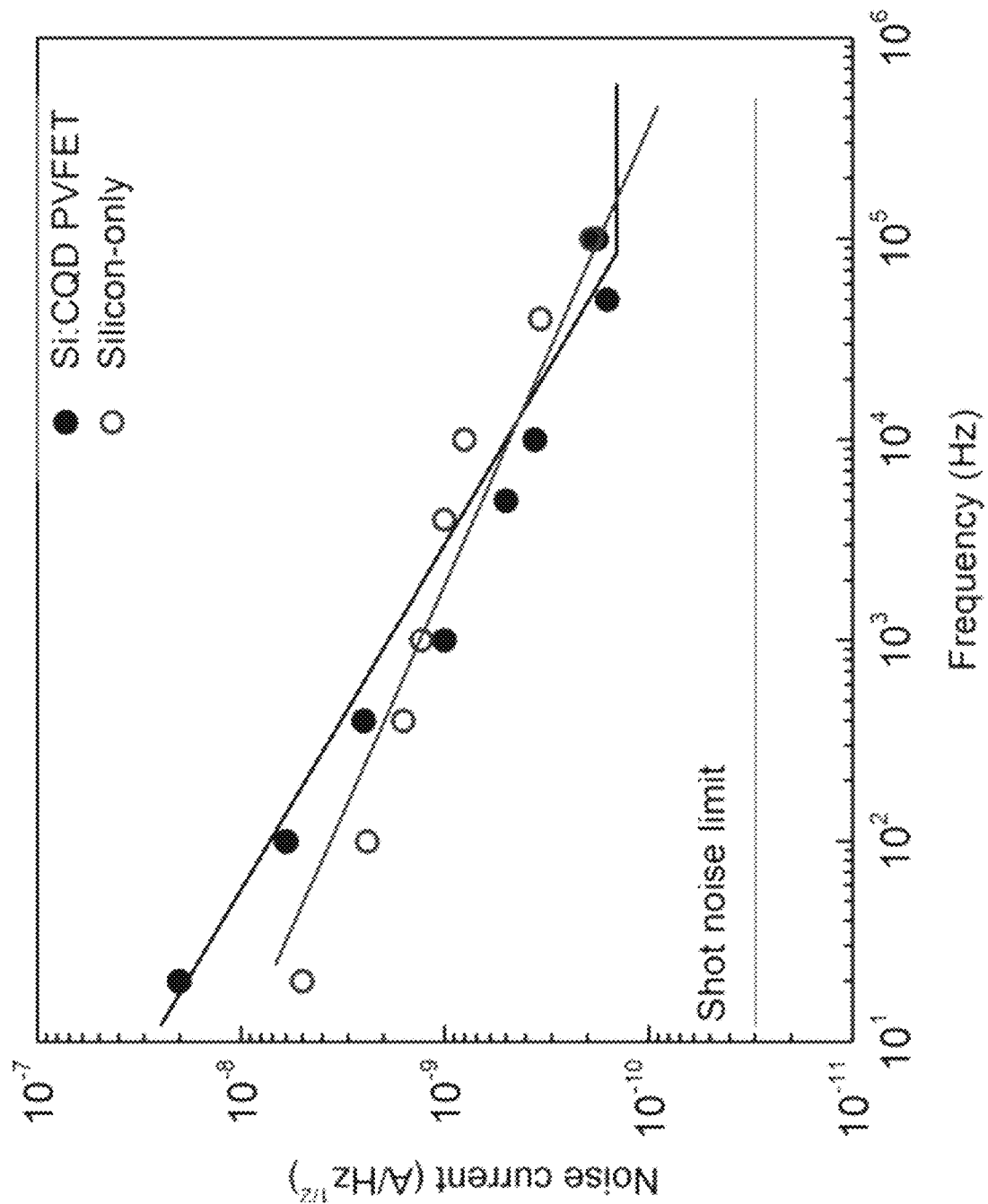
FIGS. 9A and 9B are plots illustrating the noise performance of embodiments of PVFETS.
Figure 9B:
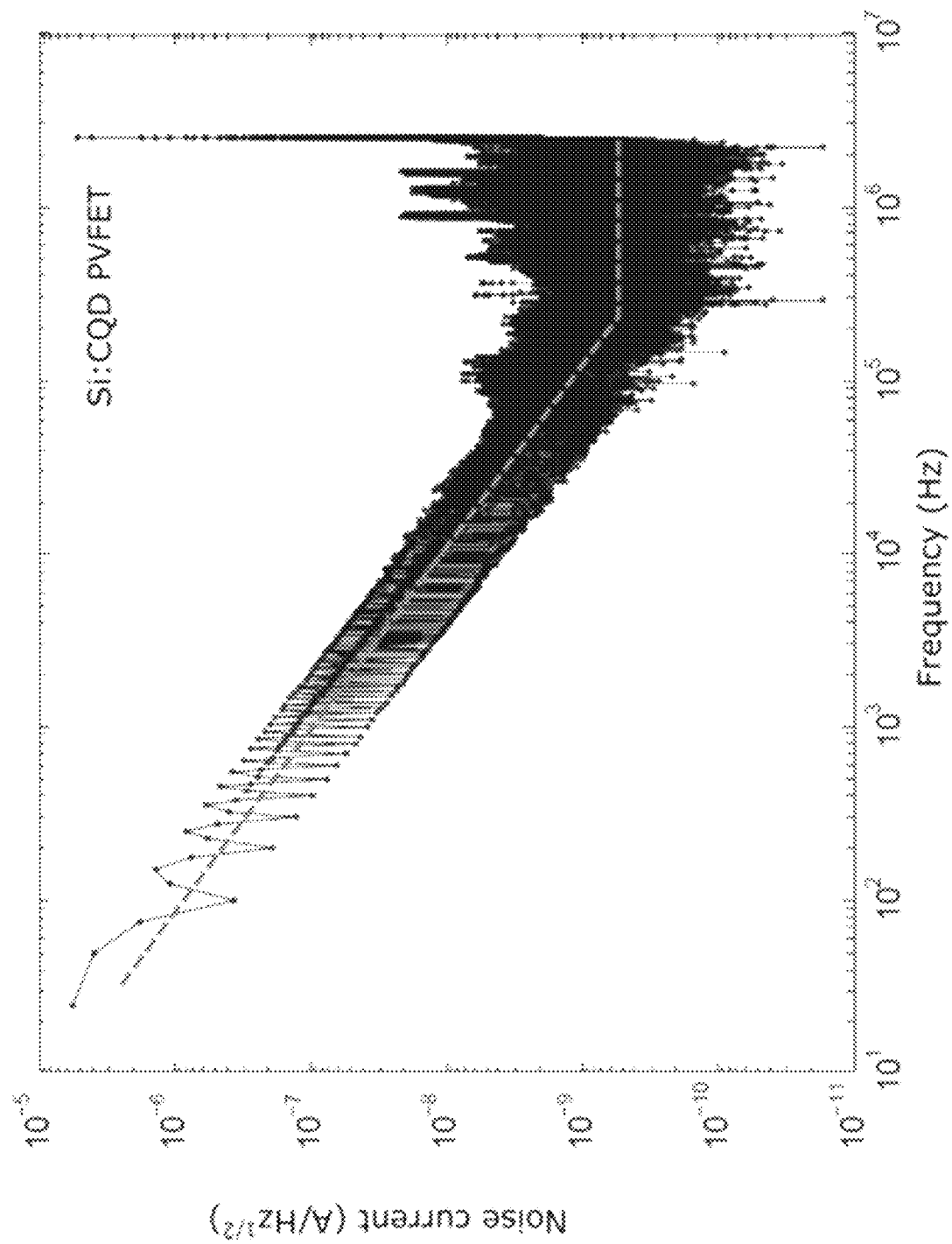

FIGS. 9A and 9B are plots comparing the silicon-only PVFET to the Si:CQD PVFET photodetectors. In the plots, the noise performance of a PVFET photodetector is plotted as a function of frequency. As illustrated, there is flicker noise at low frequencies (corner frequency at ~100 kHz) and a plateau at high frequencies that approaches the shot noise limit. FIGS. 9A and 9B also indicate that the CQD photogate does not introduce additional noise as compared with the silicon structure. The noise current was measured and a detectivity D*=1.8×$10^{12}$ Jones was measured.

Figure 10:
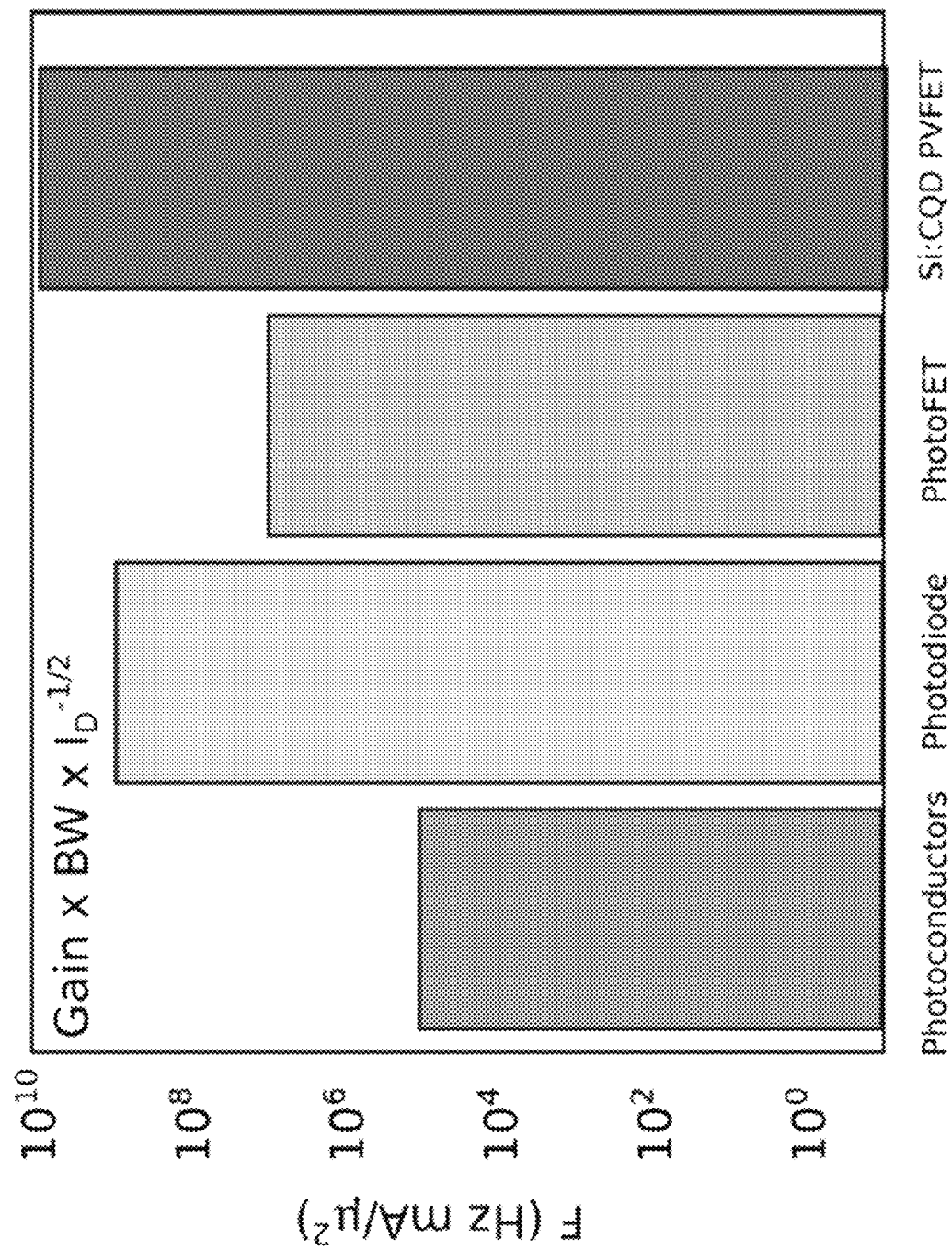
FIG. 10 is a bar chart comparing figure of merit for various photodetectors.

FIG. 10 is a bar chart comparing figure of merit F for the Si:CQD PVFET photodetector to prior CQD detectors. If one defines a figure of merit F that accounts for response, speed of response, and dark current, F=gain×BW/$J_D^{1/2}$=D*×BW, then the Si:CQD PVFET outperforms previously-presented CQD-based detectors by at least one order of magnitude. Traditional CQD-based photoFETs and photoconductors are outperformed due to their lack of bandwidth; CQD diodes, which do have a lower $I_D$, lack responsivity, and therefore present a lower F compared to the PVFET.

The experimental Si:CQD PVFET shows high gain including in the infrared (wavelengths>1500 nm) in excess of $10^4$; high speed (100 kHz); and contained dark current ($10^{-1}$-$10^1$ A/cm²). This performance can be improved further by using advanced silicon processing. The advances reported herein were possible only by devising an architecture that combines the benefits of silicon electronics with the emerging potential of colloidal quantum dots. It leverages a detection mechanism based on the photovoltaic effect combined with transconductive gain.

Examples

PVFET Fabrication.

A silicon JFET was fabricated using a standard VLSI process. A 1.6 μm epitaxial silicon layer (boron concentration ~5×$10^{15}$ cm$^{-3}$) was grown on top of a silicon substrate (300 μm, phosphorous concentration>$10^{19}$ cm$^{-3}$). Source and drain were defined on the epitaxial channel using ion implantation and lithographic patterning of aluminum contacts (channel length=5 μm, channel width=1 mm). Source and drain were successively covered with a thick (>100 nm) layer of silicon nitride. The silicon surface was then cleaned using acetone and isopropanol, and the native surface oxide was removed by using buffered oxide etchant (BOE) diluted in water (1:10). Immediately after, the surface was exposed to $CH_3I$ using ultraviolet radiation to promote the reaction in an inert nitrogen atmosphere. Finally, a thin layer of CQD (~80 nm) was deposited using a layer by layer spin-coating inside a glovebox. The CQDs were treated in the solid state using TBAI following an established procedure previously reported.

CQD Synthesis.

TMS (bis(trimethylsilyl)sulphide) (0.18 g, 1 mol) was added to ODE (1-octadecene)(10 mL), which was dried and degassed at 80° C. A mixture of oleic acid (1.34 g, 4.8 mmol), PbO (0.45 g, 2.0 mmol), and ODE (14.2 g, 56.2 mmol) was heated to 95° C. under vacuum under Ar. The flask was heated to a temperature of 125° C. and the TMS/ODE mixture was injected. The temperature was then lowered to ≈95° C. and the flask was cooled to 36° C. The nanocrystals were precipitated with acetone (50 mL) and centrifuged. The precipitate was redispersed in toluene. The nanocrystals were precipitated again with acetone (20 mL), centrifuged (5 min) and then dispersed in toluene (≈350 mg $mL^{-1}$). The quantum dots were then precipitated with methanol and dried under vacuum. They were then redispersed in toluene (100 mg $mL^{-1}$). The solutions used in final materials processing were obtained by precipitating (using methanol) from this solution and redispersing in octane (50 mg $mL^{-1}$)

TCAD Simulations.

Numerical simulations were carried out using Synopsys Sentaurus TCAD. This software has been used for the design of the silicon process (Sentaurus process) and for the simulation and the analysis of the PVFET (Sentaurus device).

Responsivity.

The responsivity was measured using a SRS 830 lock-in amplifier. A time-modulated spectrally-selected light signal was provided by using the combination of a monochromator and a mechanical chopper (frequency=20 Hz). The incident power was measured using a Newport 1830 power meter. The incident light was controlled using an aperture. The incident power was defined by integrating the optical power density on the detector active area. The PVFET was biased using two keithley 2400 sourcemeters. The signal at the lock-in input was amplified using a SRS570 current amplifier. The device was kept in a dark, shielded environment at atmosphere conditions.

Noise Current Measurements.

The noise current was measured using a SRS 830 lock-in amplifier. The device was biased using a Keithley 2400 source meter. The device was kept in a shielded, dark enclosure.

Time response. The time response was acquired using a Agilent Infiniium digital oscilloscope. Photoexcitation was provided using a LED ($\lambda$=450 nm, incident power ~1 μW). The device was biased ($V_{DS}$=2.5 V, $V_{GS}$=0 V) using two Keithley 2400 sourcemeters.

Data availability. Data acquired for this study are available at: doi:10.5061/dryad.s0k3h Although the present application describes specific features and embodiments, it is evident that various modifications and combinations can be made thereto without departing from the invention. The specification and drawings are, accordingly, to be regarded simply as an illustration as defined by the appended claims, and are contemplated to cover any and all modifications, variations, combinations or equivalents that fall within the scope of those claims.

We claim:

1. An infrared photodetector, comprising:
   a substrate comprising a semiconductor material;
   a transport channel supported by the substrate, the transport channel comprising a layer made of a silicon-based semiconductor material;
   a colloidal quantum dot-based sensitizing medium, the colloidal quantum dot-based sensitizing medium being supported by the transport channel; and
   a positive contact and a negative contact in a spaced apart configuration, the positive contact being positioned at a first end of the transport channel and the negative contact being positioned at a second end of the transport channel, the second end being opposite from the first end, the positive contact and the negative contact bracketing the colloidal quantum dot-based sensitizing medium;
   wherein a semiconductor:semiconductor heterojunction is formed at an interface between the transport channel and the colloidal quantum dot-based sensitizing medium.

2. The infrared photodetector of claim 1, wherein the colloidal quantum dot-based sensitizing medium comprises at least one nano-semiconductor.

3. The infrared photodetector of claim 2, wherein the colloidal quantum dot-based sensitizing medium comprises at least one quantum dot.

4. The infrared photodetector of claim 1, wherein the transport channel comprises a monocrystalline structure, and wherein the sensitizing medium comprises a polycrystalline structure.

5. The infrared photodetector of claim 1, wherein the electron and/or hole mobility across the semiconductor:semiconductor heterojunction is low.

6. The infrared photodetector of claim 1, wherein the colloidal quantum dot-based sensitizing medium has a different bandgap than the transport channel.

7. The infrared photodetector of claim 1, wherein the colloidal quantum dot-based sensitizing medium has a different spectral sensitivity than the transport channel.

8. The infrared photodetector of claim 1, wherein the colloidal quantum dot-based sensitizing medium has a greater sensitizing medium absorption coefficient than a transport channel absorption coefficient of the transport channel across one or more wavelengths of electromagnetic radiation.

9. The infrared photodetector of claim 8, wherein the colloidal quantum dot-based sensitizing medium absorption coefficient is at least twice as large as the transport channel absorption coefficient.

10. The infrared photodetector of claim 9, wherein the absorption coefficient is at least three times as large.

11. The infrared photodetector of claim 9, wherein the absorption coefficient is at least five times as large.

12. The infrared photodetector of claim 1, wherein the colloidal quantum dot-based sensitizing medium has a greater absorption coefficient at lower wavelengths of electromagnetic radiation than the transport channel.

13. The infrared photodetector of claim 1, wherein the colloidal quantum dot-based sensitizing medium has a greater absorption coefficient at higher wavelengths of electromagnetic radiation than the transport channel.

14. The infrared photodetector of claim 1, wherein a bias is applied to the positive contact and the negative contact, and wherein the conductivity of the transport channel may be measured by a current flowing between the positive contact and the negative contact.

15. The infrared photodetector of claim 14, further comprising an integrator for integrating the current flowing between the positive contact and the negative contact over a time period to produce a measurement of photogeneration rate over the time period.

16. The infrared photodetector of claim 1, wherein the transport channel comprises a semiconductor of a first dopant type, and wherein the colloidal quantum dot-based sensitizing medium and the substrate comprise a semiconductor of a second dopant type.

17. The infrared photodetector of claim 1, wherein the transport channel comprises an n-type semiconductor, and wherein the colloidal quantum dot-based sensitizing medium and the substrate comprise a p-type semiconductor.

18. The infrared photodetector of claim 1, wherein the transport channel comprises a p-type semiconductor, and wherein the colloidal quantum dot-based sensitizing medium and the substrate comprise an n-type semiconductor.

19. The photodetector of claim 1, wherein the colloidal quantum dot-based sensitizing medium comprises a solid film that includes at least one semiconductor quantum dot.

20. An infrared photodetector comprising:
    a silicon-based substrate;
    a silicon-based transport channel supported by the silicon-based substrate;
    a source and a drain separated by the silicon-based channel, the silicon-based transport channel being connected to the source and the drain;
    a quantum dot layer extending on top of the silicon-based transport channel, the quantum dot layer and the silicon-based substrate being oppositely doped from the silicon-based transport channel.

21. The infrared photodetector of claim 20, wherein the silicon-based transport channel is p-type, and wherein the quantum dot layer and silicon-based substrate are n-type.

22. The infrared photodetector of claim 20, wherein the silicon-based channel is n-type, and wherein the quantum dot layer and silicon-based substrate are p-type.

23. An infrared photodetector comprising:
   a silicon-based substrate;
   a quantum dot layer adapted to receive incident electromagnetic radiation;
   a silicon-based transport channel sandwiched between the silicon-based substrate and the quantum dot layer, the quantum dot layer extending over the silicon-based transport channel;
   wherein exposing the quantum dot layer to incident electromagnetic radiation generates a photovoltage between the quantum dot layer and the Silicon-based transport channel, increasing conductivity of the Silicon-based transport channel.

24. The infrared photodetector of claim 23, wherein the quantum dot layer is adapted to generate the photovoltage in response to receiving incident electromagnetic radiation of a different wavelength than the Silicon-based transport channel.

25. The infrared photodetector of claim 23, wherein the quantum dot layer is adapted to generate the photovoltage in response to receiving incident electromagnetic radiation of wavelength longer than 1100 nm.

26. An infrared photodetector comprising:
   a sensitizing medium adapted to receive electromagnetic radiation creating a junction with a silicon-based transport channel, wherein the silicon-based transport channel is adapted to exhibit a change in conductivity in response to reception of electromagnetic radiation by the sensitizing medium.

27. The infrared photodetector of claim 26, wherein the change in conductivity is proportional to an amount of electromagnetic radiation received by the sensitizing medium.

28. The infrared photodetector of claim 26, wherein the sensitizing medium is sensitive to at least one different wavelength of electromagnetic radiation than the transport channel.

29. An infrared photodetector comprising:
   a silicon-based transport channel, the silicon-based transport channel comprising a first semiconductor of a first dopant type;
   a sensitizing medium comprising a second semiconductor of a second dopant type; and
   a substrate comprising a semiconductor material, the semiconductor material being of the second dopant type, the transport channel being sandwiched between the sensitizing medium and the substrate semiconductor;
   wherein illuminating the sensitizing medium modulates the built-in potential between the sensitizing medium and the substrate, and induces a change in conductivity of the silicon-based transport channel.

30. The infrared photodetector of claim 29, wherein the silicon-based transport channel comprises a semiconductor of a first dopant type, and wherein the sensitizing medium and the substrate comprise a semiconductor of a second dopant type.

31. The infrared photodetector of claim 29, wherein the silicon-based transport channel comprises an n-type semiconductor, and wherein the sensitizing medium and the substrate comprise a p-type semiconductor.

32. The infrared photodetector of claim 29, wherein the silicon-based transport channel comprises a p-type semiconductor, and wherein the sensitizing medium and the substrate comprise an n-type semiconductor.

33. The infrared photodetector of claim 29, wherein the sensitizing medium comprises a solid film that includes at least one semiconductor quantum dot.

* * * * *